United States Patent
Ueda et al.

(10) Patent No.: US 11,049,951 B2
(45) Date of Patent: Jun. 29, 2021

(54) COATING LIQUID FOR FORMING OXIDE OR OXYNITRIDE INSULATOR FILM, OXIDE OR OXYNITRIDE INSULATOR FILM, FIELD-EFFECT TRANSISTOR, AND METHOD FOR PRODUCING THE SAME

(71) Applicants: Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP); Yuichi Ando, Hyogo (JP)

(72) Inventors: Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP); Yuichi Ando, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/425,446

(22) Filed: May 29, 2019

(65) Prior Publication Data
US 2019/0280098 A1 Sep. 12, 2019

Related U.S. Application Data

(63) Continuation of application No. PCT/JP2017/042686, filed on Nov. 28, 2017.

(30) Foreign Application Priority Data

Nov. 30, 2016 (JP) ............................. JP2016-233523

(51) Int. Cl.
*H01L 29/51* (2006.01)
*H01L 21/02* (2006.01)
(Continued)

(52) U.S. Cl.
CPC .............. *H01L 29/518* (2013.01); *C09D 1/00* (2013.01); *C09D 5/00* (2013.01); *H01L 21/0214* (2013.01);
(Continued)

(58) Field of Classification Search
CPC .............. H01L 29/518; H01L 21/0214; H01L 21/02164; H01L 21/318; H01L 29/66742; H01L 29/786
(Continued)

(56) References Cited

U.S. PATENT DOCUMENTS 5,620,910 A * 4/1997 Teramoto .......... H01L 21/28202
438/151
5,946,551 A 8/1999 Dimitrakopoulos et al.
(Continued)

FOREIGN PATENT DOCUMENTS

JP 10-270712 10/1998
JP 2001-233604 8/2001
(Continued)

OTHER PUBLICATIONS

Extended European Search Report dated Oct. 24, 2019 in Patent Application No. 17877265.3, 8 pages.
(Continued)

*Primary Examiner* — Sheikh Maruf
(74) *Attorney, Agent, or Firm* — Oblon, McClelland, Maier & Neustadt, L.L.P.

(57) ABSTRACT

A coating liquid for forming an oxide or oxynitride insulator film, the coating liquid including: A element; at least one selected from the group consisting of B element and C
(Continued)

element; and a solvent, wherein the A element is at least one selected from the group consisting of Sc, Y, Ln (lanthanoid), Sb, Bi, and Te, the B element is at least one selected from the group consisting of Ga, Ti, Zr, and Hf, the C element is at least one selected from the group consisting of Group 2 elements in a periodic table, and the solvent includes at least one selected from the group consisting of an organic solvent having a flash point of 21° C. or more but less than 200° C. and water.

20 Claims, 6 Drawing Sheets

(51) Int. Cl.
    *C09D 1/00*       (2006.01)
    *C09D 5/00*       (2006.01)
    *H01L 29/66*     (2006.01)
    *H01L 29/786*    (2006.01)
    *H01L 21/318*    (2006.01)

(52) U.S. Cl.
    CPC ...... *H01L 21/02164* (2013.01); *H01L 21/318* (2013.01); *H01L 29/66742* (2013.01); *H01L 29/786* (2013.01)

(58) Field of Classification Search
    USPC .......................................................... 257/66
    See application file for complete search history.

(56) References Cited

U.S. PATENT DOCUMENTS

| | | | |
|---|---|---|---|
| 5,981,970 A | 11/1999 | Dimitrakopoulos et al. | |
| 6,344,660 B1 | 2/2002 | Dimitrakopoulos et al. | |
| 6,344,662 B1 | 2/2002 | Dimitrakopoulos et al. | |
| 6,448,166 B2* | 9/2002 | Cho | H01L 21/28185 438/585 |
| 8,268,666 B2 | 9/2012 | Abe et al. | |
| 8,956,969 B2 | 2/2015 | Sone et al. | |
| 9,105,473 B2 | 8/2015 | Ueda et al. | |
| 9,112,039 B2 | 8/2015 | Ueda et al. | |
| 2001/0011743 A1* | 8/2001 | Arita | H01L 29/40111 257/314 |
| 2002/0001932 A1* | 1/2002 | Cho | H01L 21/02164 438/586 |
| 2002/0168785 A1* | 11/2002 | Paz de Araujo | H01L 29/40111 438/3 |
| 2003/0072975 A1* | 4/2003 | Shero | H01L 21/02189 428/704 |
| 2003/0102490 A1* | 6/2003 | Kubo | H01L 27/092 257/192 |
| 2005/0082616 A1* | 4/2005 | Chen | H01L 27/092 257/350 |
| 2005/0104131 A1* | 5/2005 | Chidambarrao | H01L 21/8213 257/369 |
| 2005/0224897 A1* | 10/2005 | Chen | H01L 29/513 257/410 |
| 2005/0269651 A1* | 12/2005 | Chen | H01L 21/31604 257/411 |
| 2006/0019462 A1* | 1/2006 | Cheng | H01L 29/739 438/400 |
| 2006/0110865 A1* | 5/2006 | Liu | H01L 21/02332 438/151 |
| 2006/0172473 A1* | 8/2006 | Cheng | H01L 21/0234 438/151 |
| 2006/0175672 A1* | 8/2006 | Matsushita | H01L 21/318 257/410 |
| 2006/0189154 A1* | 8/2006 | Ahn | H01L 21/28194 438/763 |
| 2007/0052042 A1* | 3/2007 | Ohmi | H01L 21/28167 257/411 |
| 2007/0187831 A1* | 8/2007 | Ahn | H01L 21/318 257/761 |
| 2007/0252214 A1* | 11/2007 | Zhu | H01L 21/31116 257/369 |
| 2008/0048225 A1* | 2/2008 | Ahn | H01L 21/28194 257/295 |
| 2008/0050882 A1* | 2/2008 | Bevan | H01L 21/318 438/308 |
| 2008/0057659 A1* | 3/2008 | Forbes | H01L 29/4908 438/381 |
| 2008/0286949 A1* | 11/2008 | Atanackovic | H01L 21/31604 438/481 |
| 2009/0079026 A1* | 3/2009 | Zhu | H01L 29/84 257/510 |
| 2009/0127626 A1* | 5/2009 | Zhu | H01L 21/31053 257/368 |
| 2009/0194797 A1* | 8/2009 | Shimizu | H01L 29/788 257/288 |
| 2009/0280600 A1* | 11/2009 | Hosono | H01L 27/1225 438/104 |
| 2010/0025780 A1* | 2/2010 | Kaneko | H01L 21/28194 257/411 |
| 2010/0133092 A1* | 6/2010 | Mashimo | C23C 14/225 204/192.21 |
| 2010/0140756 A1 | 6/2010 | Kozasa et al. | |
| 2010/0311564 A1* | 12/2010 | Philips | H01B 3/10 501/138 |
| 2011/0049593 A1* | 3/2011 | Schulze | H01L 29/517 257/295 |
| 2011/0128275 A1* | 6/2011 | Ueda | H01L 29/7869 345/212 |
| 2012/0248451 A1* | 10/2012 | Sone | H01L 29/7869 257/59 |
| 2013/0306975 A1* | 11/2013 | Levy | H01L 29/792 257/66 |
| 2014/0217469 A1* | 8/2014 | Sasaki | H01L 29/812 257/192 |
| 2014/0252503 A1* | 9/2014 | Chudzik | H01L 21/2807 257/411 |
| 2015/0001531 A1* | 1/2015 | Ueda | H01L 27/1225 257/43 |
| 2015/0349138 A1* | 12/2015 | Sone | H01L 27/1248 345/206 |
| 2016/0013215 A1* | 1/2016 | Ueda | C09D 5/24 345/204 |
| 2016/0293342 A1* | 10/2016 | Yumoto | H01G 9/0029 |
| 2017/0162172 A1* | 6/2017 | Saotome | H01L 27/1225 |
| 2017/0162601 A1* | 6/2017 | Arae | H01L 29/78603 |
| 2017/0170333 A1* | 6/2017 | Matsumoto | H01L 29/66969 |
| 2018/0331196 A1* | 11/2018 | Sone | H01L 27/124 |

FOREIGN PATENT DOCUMENTS

| | | | | |
|---|---|---|---|---|
| JP | 2002-543627 | | 12/2002 | |
| JP | 2007-019432 | | 1/2007 | |
| JP | 2007019432 A | * | 1/2007 | |
| JP | 2008-159824 | | 7/2008 | |
| JP | 2011-151370 | | 8/2011 | |
| JP | 2011-216845 | | 10/2011 | |
| JP | 2011216845 A | * | 10/2011 | ......... C23C 18/1216 |
| JP | 2015-061048 | | 3/2015 | |
| JP | 2016-028412 | | 2/2016 | |
| JP | 2016-47797 A | | 4/2016 | |
| JP | 2016-146495 | | 8/2016 | |
| JP | 2016-197631 | | 11/2016 | |
| JP | 2016197631 A | * | 11/2016 | |
| KR | 10-2005-0112031 | | 11/2005 | |
| KR | 10-2012-0085923 | | 8/2012 | |
| TW | 201131772 A1 | | 9/2011 | |
| TW | 201607029 A | | 2/2016 | |

OTHER PUBLICATIONS

International Search Report dated Feb. 27, 2018 for counterpart International Patent Application No. PCT/P2017/042686 filed Nov. 28, 2017 (with English Translation).

(56) References Cited

OTHER PUBLICATIONS

Written Opinion dated Feb. 27, 2018 for counterpart International Patent Application No. PCT/P2017/042686 filed Nov. 28, 2017.
Taiwanese First Office Action dated Jul. 30, 2018 for corresponding Taiwanese Application No. 106141689 (with English Translation).
Japanese Office Action dated Jun. 16, 2020 in Japanese Patent Application No. 2018-554166, 6 pages.
Office Action dated Jul. 27, 2020, in Korean Patent Application No. 10-2019-7018479 filed Nov. 28, 2017 (with English translation).

* cited by examiner

COATING LIQUID FOR FORMING OXIDE OR OXYNITRIDE INSULATOR FILM, OXIDE OR OXYNITRIDE INSULATOR FILM, FIELD-EFFECT TRANSISTOR, AND METHOD FOR PRODUCING THE SAME

CROSS-REFERENCE TO RELATED APPLICATIONS

The present application is a continuation application of International Application No. PCT/JP2017/042686, filed Nov. 28, 2017, which claims priority to Japanese Patent Application No. 2016-233523, filed Nov. 30, 2016. The contents of these applications are incorporated herein by reference in their entirety.

BACKGROUND OF THE INVENTION

Field of the Invention

The present disclosure relates to a coating liquid for forming an oxide or oxynitride insulator film, an oxide or oxynitride insulator film, a field-effect transistor, and a method for producing the coating liquid, the oxide or oxynitride insulator film, and the field-effect transistor.

Description of the Related Art

In recent years, among flat panel displays, liquid crystal displays (LCD) or organic EL displays having active matrix thin film transistors (AM-TFT) as a backplane have been the mainstream. The semiconductors used for the TFTs are divided into amorphous silicon (a-Si), low-temperature poly-silicon (LTPS), and In—Ga—Zn—O (IGZO)-based oxide semiconductors. However, materials of the gate insulating film that considerably influences properties of the TFT are roughly restricted to silicon-based materials such as $SiO_2$, SiON, and SiN (see, for example, Thin-Film Transistors, Cherie R. Kagan, Paul Andry, CRC Press (Feb. 25, 2003)).

As a method for forming such a gate insulating film, the vacuum processes such as the chemical vapor deposition (CVD) and the atomic layer deposition (ALD) are generally used.

However, these vacuum processes require, for example, complex and expensive apparatuses and safety measures with respect to source gases and process cost of the vacuum processes are high, which is problematic. In addition, because the source gases are limited, it is difficult to freely control formulation or properties of the gate insulating film.

In recent years, interest has focused on the liquid-phase method that enables cost reduction in an easy manner. As a representative silicon compound, hexamethylsilazane is considered. However, hexamethylsilazane is problematic in terms of safety and application to a process for volume production, because it has a low flash point of 14.1° C. and reacts with water in the air to generate an ammonium gas (see, for example, Japanese Unexamined Patent Application Publication No. 2008-159824).

Therefore, there is a need for providing a coating liquid for forming an oxide or oxynitride insulator film that can prepare a large area of an oxide insulator film or oxynitride insulator film having a desirably high relative permittivity at a low process temperature in a safe and easy manner.

SUMMARY OF THE INVENTION

According to one aspect of the present disclosure, a coating liquid for forming an oxide or oxynitride insulator film includes A element; at least one selected from the group consisting of B element and C element; and a solvent. The A element is at least one selected from the group consisting of Sc, Y, Ln (lanthanoid), Sb, Bi, and Te. The B element is at least one selected from the group consisting of Ga, Ti, Zr, and Hf. The C element is at least one selected from the group consisting of Group 2 elements in a periodic table. The solvent includes at least one selected from the group consisting of an organic solvent having a flash point of 21° C. or more but less than 200° C. and water.

DESCRIPTION OF THE EMBODIMENTS

Figure 1:
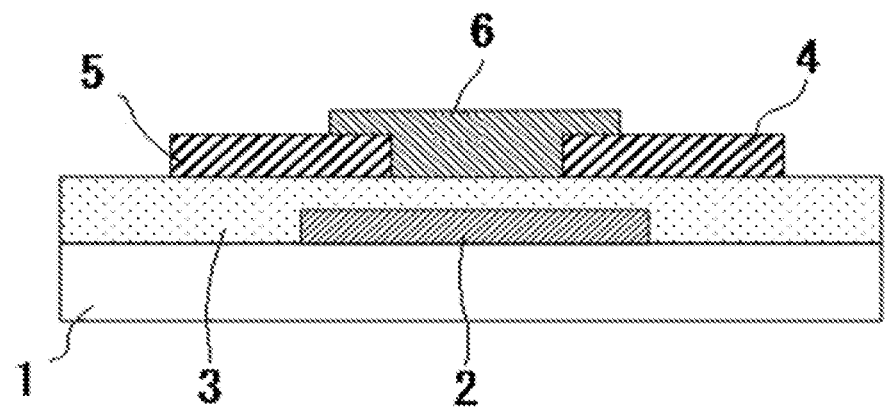
FIG. 1 is a schematic structural view illustrating one example of a bottom gate/bottom contact field-effect transistor.

An object of the present disclosure is to provide a coating liquid for forming an oxide or oxynitride insulator film that can prepare a large area of an oxide insulator film or oxynitride insulator film having a low leakage voltage and a desirably high relative permittivity at a low process temperature in a safe and easy manner.

According to the present disclosure, it is possible to provide a coating liquid for forming an oxide or oxynitride insulator film that can prepare a large area of an oxide insulator film or oxynitride insulator film having a low leakage current and a desirably high relative permittivity at a low process temperature in a safe and easy manner.

(Coating Liquid for Forming Oxide or Oxynitride Insulator Film)

A coating liquid of the present disclosure for forming an oxide or oxynitride insulator film (hereinafter may be referred to as "the present coating liquid") includes A element, at least one selected from the group consisting of B element and C element, and a solvent, and further includes other components if necessary.

The A element is at least one selected from the group consisting of Sc, Y, Ln (lanthanoid), Sb, Bi, and Te.

The B element is at least one selected from the group consisting of Ga, Ti, Zr, and Hf.

The C element is at least one selected from the group consisting of Group 2 elements in the periodic table.

The solvent includes at least one selected from the group consisting of an organic solvent having a flash point of 21° C. or more but less than 200° C. and water.

In another aspect of the present disclosure, a coating liquid for forming an oxide or oxynitride insulator film includes A element and at least one selected from the group consisting of B element and C element, and further includes other components if necessary.

The coating liquid of another aspect can prepare a large area of an oxide insulator film or oxynitride insulator film having a low leakage current and a desirably high relative permittivity at a low process temperature in an easy manner.

A type of the solvent used in the coating liquid of another aspect is not particularly limited.

Similarly to the present coating liquid, the coating liquid of another aspect can be used for producing, for example, oxide or oxynitride insulator films, field-effect transistors, and semiconductor elements.

The A element is a main constituent element of the present coating liquid and forms a main skeleton of an insulating film.

The B element adjusts properties such as thermal property and relative permittivity.

The C element forms a network modifying oxide and imparts flexibility to the structure.

In the present disclosure and in the specification of the present disclosure, "film" and "layer" have the same meaning unless otherwise specified. For example, the insulating film and the insulating layer have the same meaning.

The coating liquid for forming an oxide or oxynitride insulator film is preferably one obtained by dissolving, in the solvent, at least one selected from the group consisting of inorganic salts, oxides, hydroxides, organic acid salts, metal alkoxides, organometallics, and metal complexes each of which includes the A element, and at least one selected from the group consisting of inorganic salts, oxides, hydroxides, organic acid salts, metal alkoxides, organometallics, and metal complexes each of which includes at least one selected from the group consisting of the B element and the C element.

The inorganic salts, the oxides, the hydroxides, the organic acid salts, the metal alkoxides, the organometallics, and the metal complexes may be uniformly dissolved in the solvent and may be dissociated to become ions.

When the inorganic salts, the oxides, the hydroxides, the organic acid salts, the metal alkoxides, the organometallics, and the metal complexes are dissolved in the coating liquid for forming an oxide or oxynitride insulator film, segregation of the concentration in the coating liquid for forming an oxide or oxynitride insulator film hardly occurs. Therefore, the coating liquid for forming an oxide or oxynitride insulator film can be used for a long period of time. In addition, a thin film produced by using this coating liquid also has a homogeneous formulation. Therefore, characteristic uniformity is also favorable when it is used in, for example, the gate insulating layer of TFTs.

A gate insulating layer is required to have a high insulating property (low leakage current) and a high relative permittivity. However, the A element or the B element is a main constituent element of the present coating liquid. The oxide insulator film or the oxynitride insulator film prepared using the present coating liquid realizes a high relative permittivity and a low dielectric loss.

Incorporation of the C element into the present coating liquid increases a degree of freedom of the structure of the oxide insulator film or the oxynitride insulator film obtained, which makes it possible to expand a control range of properties of the insulator film. The C element is at least one selected from the group consisting of Be, Mg, Ca, Sr, and Ba.

As the TFT characteristics, no hysteresis is required. However, the insulator film of the present disclosure is a paraelectric having a high insulating property, which makes it possible to achieve TFT characteristics having high quality.

When the formulation and the conditions of the heat treatment are controlled, it is possible to form an insulating film that is in state of being amorous or microcrystal, achieving a lower dielectric loss.

The insulator film constituting the gate insulating layer is required to have a high insulating property (high resistance) as described above. Therefore, the film desirably has a wide band gap energy (preferably 3 eV or more).

Therefore, the present coating liquid and the oxide or oxynitride insulator film prepared using the present coating liquid have no optical absorption band resulting from the electron transition in the visible light region or the near-infrared region. Therefore, the present coating liquid and the oxide or oxynitride insulator film prepared using the present coating liquid do not include any of the Group 5 to 11 transition metal elements other than impurities (about several mol percentages). These elements easily have an open-shell electronic state and then an absorption band resulting from the d-d transition in the aforementioned wavelength regions will occur. Therefore, these elements are not suitable for an element constituting an insulator. Meanwhile, some lanthanoid elements have a narrow absorption band in the visible light region or the near-infrared region. However, the absorption is the f-f transition isolated on the atom and an insulating property can be maintained. Therefore, the present coating liquid and the oxide or oxynitride insulator film prepared using the present coating liquid may include the lanthanoid element.

Hitherto, a method for increasing amorphous property and realizing a high insulating property by incorporation of Si or Al as a main component has been employed, but is not preferable in order to realize a high permittivity. The A element, which is a main constituent element in the present coating liquid and the oxide or oxynitride insulator film prepared using the present coating liquid, is preferably at least one selected from the group consisting of the Period 4 elements, the Period 5 elements, and the Period 6 elements. The A element is an element where the s-orbital, the p-orbital, and the d-orbital are a closed-shell. Therefore, it is possible to realize a high permittivity and a low dielectric loss at the same time.

A volume resistivity of the insulating film of the present disclosure is preferably $10^6$ Ωcm or more, more preferably $10^{10}$ Ωcm or more.

A gate current of the field-effect transistor including the insulating film of the present disclosure as a gate insulating film is preferably 1 nA or less, more preferably 1 pA or less, still more preferably 100 fA or less.

Even when the present coating liquid includes the C element, the A element or the B element is a main constituent element of the present coating liquid. In that respect, a total number of atoms of the A element (NA), a total number of atoms of the B element (NB), and a total number of atoms of the C element (NC) preferably satisfy Formula (1) below.

$$(NA+NB)/(NA+NB+NC) \geq 0.5 \qquad \text{Formula (1)}$$

The total number of atoms of the A element (NA), the total number of atoms of the B element (NB), and the total number of atoms of the C element (NC) more preferably satisfy Formula (2) below.

$$NA/(NA+NB+NC) \geq 0.5 \qquad \text{Formula (2)}$$

Moreover, the total number of atoms of the B element (NB) and the total number of atoms of the C element (NC) preferably satisfy Formula (3) below.

$$NB > NC \qquad \text{Formula (3)}$$

Use of the coating liquid for forming an oxide or oxynitride insulator film makes it possible to obtain the oxide insulator film or the oxynitride insulator film having desired relative permittivity and dielectric loss.

Note that, regarding the coating liquid for forming an oxide or oxynitride insulator film, it is possible to control relative permittivity and dielectric loss of the oxide insulator film or the oxynitride insulator film obtained depending on the conditions (specifically, a kind of the solvent in which the solute is dissolved, formulation of the coating liquid, and a concentration of the coating liquid). Moreover, it is possible to control relative permittivity and dielectric loss depending on the conditions of the heat treatment after the coating (more specifically, a baking temperature, a baking time, a heating speed, a cooling speed, and atmosphere (gas percentage and pressure) during the baking.

Moreover, the effects of the irradiation of light can be used; those are, for example, the decomposition of the materials and the acceleration of the reaction. Furthermore, relative permittivity and dielectric loss are also changed by annealing after formation of the film. Therefore, a method for optimizing the annealing temperature and the atmosphere is also effective.

It is difficult to achieve a uniform formulation of the target used by, for example, the sputtering method and the laser abrasion method. In particular, it may be difficult to prepare the target itself depending on the formulation. Moreover, sputtering efficiency of each element is different, and thus it is difficult to uniformly maintain the formulation within duration of the target life. Furthermore, use of the vacuum process makes it difficult to reduce an amount of oxygen vacancies in the films. This leads to instability in the properties of the film.

Use of the coating liquid for forming an oxide or oxynitride insulator film solves the problems in the vacuum process and makes it possible to produce an oxide insulator film or an oxynitride insulator film having a uniform and stable formulation. Consequently, it is possible to stably produce TFTs having high performance.

Examples of the A element include Sc, Y, Ln (lanthanoid), Sb, Bi, and Te. One example of the A element is, for example, at least one selected from the group consisting of Sc, Y, and Ln (lanthanoid). One example of the A element is, for example, at least one selected from the group consisting of Sb, Bi, and Te. Among them, the Group 3 elements in the periodic table are preferable, Sc, Y, La, Ce, Gd, and Lu are more preferable, in terms of safety, mass productivity, and physical properties.

Examples of the B element include Ga, Ti, Zr, and Hf. However, at least one selected from the group consisting of Ti, Zr, and Hf is preferable, at least one selected from the group consisting of Zr and Hf is particularly preferable, in terms of mass productivity and physical properties.

The C element is at least one selected from the group consisting of Group 2 elements in the periodic table.

Examples of the Group 2 elements include Be, Mg, Ca, Sr, Ba, and Ra. However, at least one selected from the group consisting of Mg, Ca, Sr, and Ba is more preferable in terms of safety and mass productivity.

The coating liquid for forming an oxide or oxynitride insulator film is preferably transparent or light yellow in a visible light region.

Moreover, the gate insulating film is required to have a low leakage current. Although it depends on resolution of the AM-TFT, a required value of the gate electric current Ig is, for example, 10 pA order or less. In order to satisfy the requirement, the oxide or oxynitride film having a low hydroscopic property, being highly amorphous, and having a wide band gap energy is important.

In order to satisfy the requirement, it is preferable that a content ratio of the Group 3 element be high. A total number of atoms of the Group 3 element (NA) is preferably 50% or more, more preferably 75% or more, relative to the total number of the metal elements in the oxide or oxynitride resulting from the heat treatment. Basically, the heat treatment is preferably performed so that a ratio of the metal elements in the coating liquid is maintained in the insulating film.

When the ratio of the Group 2 element (particularly Sr and Ba) is high, the hygroscopic property becomes high, which adversely affects the insulating property of the film. Therefore, it is necessary to lower a ratio of the NC as presented in the Formula (1) to the Formula (3). Meanwhile, when oxide or oxynitride is formed by combining the Group 2 element and the Group 3 element, and further the Group 4 element, a highly amorphous combination exists. Therefore, it is possible to inhibit the leakage current resulting from grain boundary of the polycrystalline film. Generation of the crystal phase depends on the heat treatment process. Therefore, the formulation of the coating liquid may be appropriately adjusted depending on the required process conditions. Nano-size microcrystals (such a degree that spots are observed through electron beam diffraction) may partially exist in the amorphous film. Such a film has the same electrical and optical properties as those of the amorphous film, and can be considered as the amorphous film. The Group 13 element (particularly, Al and Ga) easily forms a perovskite crystal with the Group 3 element (particularly, La). Therefore, this combination is preferably avoided. Addition of Si that is the Group 14 element increases an amorphous property, but lowers a relative permittivity, which is not preferable.

The oxide or oxynitride obtained from the combination including the Group 2 element and the Group 3 element, and further the Group 4 element is basically an insulator having a band gap energy of 3 eV or more, or an insulator having a band gap energy of 5 eV or more in some cases.

Therefore, the present coating liquid and the oxide or oxynitride insulator film prepared using the present coating liquid have no optical absorption band resulting from the electron transition in the visible light region or the near-infrared region. Therefore, the present coating liquid and the oxide or oxynitride insulator film prepared using the present coating liquid do not include any of the Group 5 to 11 transition metal elements other than impurities (about several mol percentages). These elements easily have an open-shell electronic state and then an absorption band resulting from the d-d transition in the aforementioned wavelength regions will occur. Therefore, these elements are not suitable for an element constituting an insulator. Meanwhile, some lanthanoid elements have a narrow absorption band in the visible light region or the near-infrared region. However, the absorption is the f-f transition isolated on the atom and an insulating property can be maintained. Therefore, the present coating liquid and the oxide or oxynitride insulator film prepared using the present coating liquid may include the lanthanoid element.

The A element, the B element, and the C element are dissolved in the solvent as compounds or ions. After coating, an oxide or oxynitride insulating film can be obtained through a predetermined heat treatment. A compound each including A element, the B element, and the C element or counter anions and the solvent are volatilized through the heat treatment, or are oxidized-decomposed into low molecules such as $CO_2$, $NO_2$, and $H_2O$ by, for example, oxygen in the atmosphere. Those other than the oxide or the oxynitride are released outside the film.

Moreover, the coating liquid of the present disclosure preferably has a flash point of 37.8° C. (100° F.) or more, more preferably has a flash point of 40° C. or more. An upper limit of the flash point is not particularly limited and may be appropriately selected depending on the intended purpose. The upper limit thereof may be 100° C., the upper limit thereof may be 150° C., and the upper limit thereof may be 190° C.

The flash point of the coating liquid is particularly preferably 50° C. or more considering, for example, a rise in temperature during transportation.

When the flash point is equal to or lower than room temperature, it may be volatilized at normal temperature to form a flammable mixture with air. The flammable mixture ignites and burns when there is a source of ignition, which is dangerous. When the flash point is 40° C. or more, it is sufficiently higher than an environment at which general TFTs are produced, and thus a safety handling can be achieved.

To that end, the coating liquid includes, as the solvent, at least one selected from the group consisting of an organic solvent having a flash point of 21° C. or more but less than 200° C. and water.

The coating liquid of the present disclosure is preferably free of a solvent having a flash point of less than 21° C.

The coating liquid of the present disclosure is preferably free of special inflammable materials such as diethyl ether, class I petroleums such as acetone and toluene, and alcohols having from 1 through 3 carbon atoms. Here, the phrase "free of" does not exclude inevitable inclusion.

In the coating liquid, an amount of the solvent, which is selected from the group consisting of an organic solvent having a flash point of 21° C. or more but less than 200° C. and water, is preferably from 85% by volume through 100% by volume, more preferably from 90% by volume through 100% by volume, particularly preferably from 95% by volume through 100% by volume.

In the coating liquid, an amount of an organic solvent other than the organic solvent having a flash point of 21° C. or more but less than 200° C. is preferably 15% by volume or less, more preferably 10% by volume or less, particularly preferably 5% by volume or less.

Examples of the organic solvent other than the organic solvent having a flash point of 21° C. or more but less than 200° C. include organic solvents having a flash point of less than 21° C. and organic solvents having a flash point of 200° C. or more.

Note that, the density of the organic solvent is within a range of from 0.75 through 1.15. Therefore, the term "% by weight" is such a range that is obtained by taking the above-described "density" into account in the above-described "% by volume".

In addition, the coating liquid of the present disclosure preferably includes at least two or more solvents selected from the group consisting of class II petroleums (having a flash point of 20° C. or more but less than 70° C.), class III petroleums (having a flash point of 70° C. or more but less than 200° C.), and water.

The class II petroleums include a solvent having a flash point of less than 40° C. However, such a solvent can be appropriately mixed with class III petroleum or water, resulting in the coating liquid having a flash point of 37.8° C. or more, further 40° C. or more.

In addition, when two or more solvents selected from the group consisting of class II petroleums, class III petroleums, and water are appropriately selected, mixed, and included, the viscosity and the surface tension of the present coating liquid can be adjusted, which makes it possible to obtain a desirable property of the coated film with the safety being ensured.

In terms of safety, the class IV petroleums (having a flash point of 200° C. or more but less than 250° C.) are preferable because of a high flash point. However, because the class IV petroleums have a high boiling point (generally, 350° C. or more), hydrocarbon-based impurities derived from the solvent easily remain in the film even after baking. Therefore, the class IV petroleums are not preferable as the solvent of the present disclosure.

Here, each of the special inflammable materials, the class I petroleums, the class II petroleums, the class III petroleums, and the class IV petroleums is a term defined below.

The special inflammable materials belong to a category including items that correspond to the class IV hazardous materials and the special inflammable materials under the Fire Services Act of Japan, and are those having an ignition point of 100° C. or less at 1 atm or those having a flash point of 20° C. below zero and a boiling point of 40° C. or less.

The class I petroleums belong to a category including items that correspond to the class IV hazardous materials and the class I petroleums (liquid having a flash point of less than 21° C. at 1 atm) under the Fire Services Act of Japan.

The class II petroleums belong to a category including items that correspond to the class IV hazardous materials and the class II petroleums (liquid having a flash point of 21° C. or more but less than 70° C. at 1 atm) under the Fire Services Act of Japan.

The class III petroleums belong to a category including items that correspond to the class IV hazardous materials and the class III petroleums (liquid having a flash point of 70° C. or more but less than 200° C.) under the Fire Services Act of Japan.

The class IV petroleums belong to a category including items that correspond to the class IV hazardous materials and the class IV petroleums (liquid having a flash point of 200° C. or more but less than 250° C.) under the Fire Services Act of Japan.

The flash point is measured through the Seta closed cup type (rapid equilibrium closed cup method) according to ISO 3679: 2004 or JIS K 2265-2: 2007.

Examples of the class II petroleums (liquid having a flash point of 21° C. or more but less than 70° C. at 1 atm) include the following solvents.

n-Decane: flash point 46° C.
Acetylacetone: flash point 34° C.
p-Xylene: flash point 27° C.
Mesitylene (1,3,5-Trimethylbenzene): flash point 50° C.
Decahydronaphthalene (decalin): flash point 58° C.
Propylene glycol 1-monomethyl ether: flash point 32° C.
Ethylene glycol monomethyl ether: flash point 42° C.
Ethylene glycol monoisopropyl ether: flash point 46° C.
N,N-Dimethylformamide: flash point 58° C.
N,N-Dimethylacetamide: flash point 63° C.
1-Butanol: flash point 37° C.
Cyclopentanol: flash point 47° C.
1-Pentanol: flash point 43° C.
Isopentanol: flash point 46° C.
1-Hexanol: flash point 63° C.

Examples of the class III petroleums (liquid having a flash point of 70° C. or more but less than 200° C. at 1 atm) include the following solvents.

Octylic acid: flash point 118° C.
Cyclohexylbenzene: flash point 99° C.
γ-Butyrolactone: flash point 98° C.
Ethylene glycol: flash point 111° C.
Propylene glycol: flash point 99° C.
Formamide: flash point 120° C.
1,3-Dimethyl-2-imidazolidinone: flash point 107° C.
1,3-Dimethyl-3,4,5,6-tetrahydro-2(1H)-pyrimidinone: flash point 121° C.

Examples of the class IV petroleums (liquid having a flash point of 200° C. or more but less than 250° C. at 1 atm) include the following solvents.

Dioctyl phthalate: flash point 218° C.
Benzyl butyl phthalate: flash point 213° C.

Hereinafter, the coating liquid for forming an oxide or oxynitride insulator film will be described in details.

The coating liquid for forming an oxide or oxynitride insulator film is obtained by dissolving, in the solvent, for example, an A element-including compound including the A element, a B element-including compound including the B element, and a C element-including compound including the C element.

Examples of the A element-including compound include inorganic salts, oxides, hydroxides, organic acid salts, metal alkoxides, organometallics, and metal complexes.

Examples of the B element-including compound include inorganic salts, oxides, hydroxides, organic acid salts, metal alkoxides, organometallics, and metal complexes.

Examples of the C element-including compound include inorganic salts, oxides, hydroxides, organic acid salts, metal alkoxides, organometallics, and metal complexes.

Hereinafter, the above compounds will be described one by one.

<<Scandium-Including Compound>>

Scandium (Sc) belongs to the A element.

The scandium-including compound belongs to the A element-including compound.

The scandium-including compound is not particularly limited and may be appropriately selected depending on the intended purpose. Examples of the scandium-including compound include organic scandium compounds and inorganic scandium compounds.

—Organic Scandium Compound—

The organic scandium compounds are not particularly limited and may be appropriately selected depending on the intended purpose, so long as the organic scandium compounds are compounds each including scandium and an organic group. The scandium and the organic group are bound via, for example, an ionic bond, a covalent bond, or a coordination bond.

The organic group is not particularly limited and may be appropriately selected depending on the intended purpose. Examples of the organic group include an alkoxy group that may have a substituent, an acyloxy group that may have a substituent, and an acetylacetonato group that may have a substituent.

Examples of the alkoxy group include an alkoxy group including 1 through 6 carbon atoms.

Examples of the acyloxy group include an acyloxy group including 1 through 10 carbon atoms.

Examples of the substituent include halogen and a tetrahydrofuryl group.

Examples of the organic scandium compounds include scandium 2-ethylhexanoate, scandium isopropoxide, and scandium acetylacetonato.

—Inorganic Scandium Compound—

The inorganic scandium compounds are not particularly limited and may be appropriately selected depending on the intended purpose. Examples of the inorganic scandium compounds include scandium oxoacids and scandium halides.

Examples of the scandium oxoacids include scandium nitrates and scandium carbonates.

Examples of the scandium halides include scandium halides, scandium chlorides, scandium bromides, and scandium iodides.

Among them, scandium oxoacids and scandium halides are preferable, scandium nitrates and scandium chlorides are more preferable, in terms of high solubility in various solvents.

The scandium nitrates are not particularly limited and may be appropriately selected depending on the intended purpose. Examples of the scandium nitrates include scandium nitrate hydrates. Examples of the scandium nitrate hydrates include scandium nitrate pentahydrate.

The scandium chlorides are not particularly limited and may be appropriately selected depending on the intended purpose. Examples of the scandium chlorides include scandium chloride anhydrides and scandium chloride hydrates. Examples of the scandium chloride hydrates include scandium chloride hexahydrate.

These scandium-including compounds may be synthesized or may be commercially available products.

<<Yttrium-Including Compound>>

Yttrium (Y) belongs to the A element.

The yttrium-including compound belongs to the A element-including compound.

The yttrium-including compound is not particularly limited and may be appropriately selected depending on the intended purpose. Examples of the yttrium-including compounds include organic yttrium compounds and inorganic yttrium compounds.

—Organic Yttrium Compound—

The organic yttrium compounds are not particularly limited and may be appropriately selected depending on the intended purpose, so long as the organic yttrium compounds are compounds each including yttrium and an organic group. The yttrium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic scandium compound.

Examples of the organic yttrium compounds include yttrium 2-ethylhexanoate, yttrium isopropoxide, and yttrium acetylacetonato.

—Inorganic Yttrium Compound—

The inorganic yttrium compounds are not particularly limited and may be appropriately selected depending on the intended purpose. Examples of the inorganic yttrium compounds include yttrium oxoacids and yttrium halides.

Examples of the yttrium oxoacids include yttrium nitrates, yttrium sulfates, yttrium carbonates, and yttrium phosphates.

Examples of the yttrium halides include yttrium fluorides, yttrium chlorides, yttrium bromides, and yttrium iodides.

Among them, yttrium oxoacids and yttrium halides are preferable, yttrium nitrates and yttrium chlorides are more preferable, in terms of high solubility in various solvents.

The yttrium nitrates are not particularly limited and may be appropriately selected depending on the intended purpose. Examples of the yttrium nitrates include yttrium nitrate hydrates. Examples of the yttrium nitrate hydrates include yttrium nitrate hexahydrate.

The yttrium chlorides are not particularly limited and may be appropriately selected depending on the intended purpose. Examples of the yttrium chlorides include anhydrous yttrium chlorides and yttrium chloride hydrates. Examples of the yttrium chloride hydrates include yttrium chloride hexahydrate.

These yttrium-including compounds may be synthesized or may be commercially available products.

<<Lanthanoid-Including Compound>>

Lanthanoid (Ln) belongs to the A element.

The lanthanoid-including compound belongs to the A element-including compound.

A lanthanum-including compound, a cerium-including compound, and a lutetium-including compound as typical examples of the lanthanoid-including compound will be described below.

<<<Lanthanum-Including Compound>>>

Lanthanum (La) is one example of lanthanoid (Ln).

Lanthanum (La) belongs to the A element.

The lanthanum-including compound belongs to the A element-including compound.

The lanthanum-including compound is not particularly limited and may be appropriately selected depending on the intended purpose. Examples of the lanthanum-including compound include organic lanthanum compounds and inorganic lanthanum compounds.

—Organic Lanthanum Compound—

The organic lanthanum compounds are not particularly limited and may be appropriately selected depending on the intended purpose, so long as the organic lanthanum compounds are compounds each including lanthanum and an organic group. The lanthanum and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic scandium compound.

Examples of the organic lanthanum compounds include lanthanum 2-ethylhexanoate, lanthanum isopropoxide, and lanthanum acetylacetonato.

—Inorganic Lanthanum Compound—

The inorganic lanthanum compounds are not particularly limited and may be appropriately selected depending on the intended purpose. Examples of the inorganic lanthanum compounds include lanthanum oxoacids and lanthanum halides.

Examples of the lanthanum oxoacids include lanthanum nitrates, lanthanum sulfates, lanthanum carbonates, and lanthanum phosphates.

Examples of the lanthanum halides include lanthanum fluorides, lanthanum chlorides, lanthanum bromides, and lanthanum iodides.

Among them, lanthanum oxoacids and lanthanum halides are preferable, lanthanum nitrates and lanthanum chlorides are more preferable, in terms of high solubility in various solvents.

The lanthanum nitrates are not particularly limited and may be appropriately selected depending on the intended purpose. Examples of the lanthanum nitrates include lanthanum nitrate hydrates. Examples of the lanthanum nitrate hydrates include lanthanum nitrate tetrahydrate and lanthanum nitrate hexahydrate.

The lanthanum chlorides are not particularly limited and may be appropriately selected depending on the intended purpose. Examples of the lanthanum chlorides include anhydrous lanthanum chlorides and lanthanum chloride hydrates. Examples of the lanthanum chloride hydrates include lanthanum chloride heptahydrate.

These lanthanum-including compounds may be synthesized or may be commercially available products.

<<<Cerium-Including Compound>>>

Cerium (Ce) is one example of lanthanoid (Ln).

Cerium (Ce) belongs to the A element.

The cerium-including compound belongs to the A element-including compound.

The cerium-including compound is not particularly limited and may be appropriately selected depending on the intended purpose. Examples of the cerium-including compound include organic cerium compounds and inorganic cerium compounds.

—Organic Cerium Compound—

The organic cerium compounds are not particularly limited and may be appropriately selected depending on the intended purpose, so long as the organic cerium compounds are compounds each including cerium and an organic group. The cerium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic scandium compound.

Examples of the organic cerium compounds include cerium 2-ethylhexanoate, cerium isopropoxide, and cerium acetylacetonato.

—Inorganic Cerium Compound—

The inorganic cerium compounds are not particularly limited and may be appropriately selected depending on the intended purpose. Examples of the inorganic cerium compounds include cerium oxoacids and cerium halides.

Examples of the cerium oxoacids include cerium nitrates, cerium sulfates, cerium carbonates, and cerium oxalates.

Examples of the cerium halides include cerium fluorides, cerium chlorides, cerium bromides, and cerium iodides.

Among them, cerium oxoacids and cerium halides are preferable, cerium nitrates and cerium chlorides are more preferable, in terms of high solubility in various solvents.

The cerium nitrates are not particularly limited and may be appropriately selected depending on the intended purpose. Examples of the cerium nitrates include cerium nitrate hydrates. Examples of the cerium nitrate hydrates include cerium nitrate hexahydrate.

The cerium chlorides are not particularly limited and may be appropriately selected depending on the intended purpose. Examples of the cerium chlorides include anhydrous cerium chlorides and cerium chloride hydrates. Examples of the cerium chloride hydrates include cerium chloride heptahydrate.

These cerium-including compounds may be synthesized or may be commercially available products.

<<<Lutetium-Including Compound>>>

Lutetium (Lu) is one example of lanthanoid (Ln).

Lutetium (Lu) belongs to the A element.

The lutetium-including compound belongs to the A element-including compound.

The lutetium-including compound is not particularly limited and may be appropriately selected depending on the intended purpose. Examples of the lutetium-including compound include organic lutetium compounds and inorganic lutetium compounds.

—Organic Lutetium Compound—

The organic lutetium compounds are not particularly limited and may be appropriately selected depending on the intended purpose, so long as the organic lutetium compounds are compounds each including lutetium and an organic group. The lutetium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic scandium compound.

Examples of the organic lutetium compound include lutetium 2-ethylhexanoate, lutetium isopropoxide, and lutetium acetylacetonato.

—Inorganic Lutetium Compound—

The inorganic lutetium compounds are not particularly limited and may be appropriately selected depending on the intended purpose. Examples of the inorganic lutetium compounds include lutetium oxoacids and lutetium halides.

Examples of the lutetium oxoacids include lutetium nitrates, lutetium sulfates, lutetium carbonates, and lutetium oxalates.

Examples of the lutetium halides include lutetium fluorides, lutetium chlorides, lutetium bromides, and lutetium iodides.

Among them, lutetium oxoacids and lutetium halides are preferable, lutetium nitrates and lutetium chlorides are more preferable, in terms of high solubility in various solvents.

The lutetium nitrates are not particularly limited and may be appropriately selected depending on the intended purpose. Examples of the lutetium nitrates include lutetium nitrate hydrates. Examples of the lutetium nitrate hydrates include lutetium nitrate hexahydrate.

The lutetium chlorides are not particularly limited and may be appropriately selected depending on the intended purpose. Examples of the lutetium chlorides include anhydrous lutetium chlorides and lutetium chloride hydrates. Examples of the lutetium chloride hydrates include lutetium chloride hexahydrate.

These lutetium-including compounds may be synthesized or may be commercially available products.

<<Zirconium-Including Compound>>

Zirconium (Zr) belongs to the B element.

The zirconium-including compound belongs to the B element-including compound.

The zirconium-including compound is not particularly limited and may be appropriately selected depending on the intended purpose. Examples of the zirconium-including compound include organic zirconium compounds and inorganic zirconium compounds.

—Organic Zirconium Compound—

The organic zirconium compounds are not particularly limited and may be appropriately selected depending on the intended purpose, so long as the organic zirconium compounds are compounds each including zirconium and an organic group. The zirconium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic scandium compound.

Examples of the organic zirconium compounds include zirconium 2-ethylhexanoate, zirconium isopropoxide, and zirconium acetylacetonato.

—Inorganic Zirconium Compound—

The inorganic zirconium compounds are not particularly limited and may be appropriately selected depending on the intended purpose. Examples of the inorganic zirconium compounds include zirconium oxoacids and zirconium halides.

Examples of the zirconium oxoacids include zirconium nitrate oxides, zirconium sulfates, zirconium carbonates, and zirconium hydroxides.

Examples of the zirconium halides include zirconium fluorides, zirconium chlorides, zirconium bromides, and zirconium iodides.

Among them, zirconium oxoacids and zirconium halides are preferable, zirconium nitrate oxides and zirconium chlorides are more preferable, in terms of high solubility in various solvents.

The zirconium nitrate oxides are not particularly limited and may be appropriately selected depending on the intended purpose. Examples of the zirconium nitrate oxides include zirconium nitrate oxide hydrates. Examples of the zirconium nitrate oxide hydrates include zirconium nitrate oxide dihydrate.

The zirconium chlorides are not particularly limited and may be appropriately selected depending on the intended purpose. Examples of the zirconium chlorides include anhydrous zirconium chlorides and zirconium chloride hydrates.

These zirconium-including compounds may be synthesized or may be commercially available products.

<<Hafnium-Including Compound>>

Hafnium (Hf) belongs to the B element.

The hafnium-including compound belongs to the B element-including compound.

The hafnium-including compound is not particularly limited and may be appropriately selected depending on the intended purpose. Examples of the hafnium-including compound include organic hafnium compounds and inorganic hafnium compounds.

—Organic Hafnium Compound—

The organic hafnium compounds are not particularly limited and may be appropriately selected depending on the intended purpose, so long as the organic hafnium compounds are compounds each including hafnium and an organic group. The hafnium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic scandium compound.

Examples of the organic hafnium compounds include hafnium 2-ethylhexanoate, hafnium butoxide, and hafnium acetylacetonato.

—Inorganic Hafnium Compound—

The inorganic hafnium compounds are not particularly limited and may be appropriately selected depending on the intended purpose. Examples of the inorganic hafnium compounds include hafnium oxoacids and hafnium halides.

Examples of the hafnium oxoacids include hafnium sulfates.

Examples of the hafnium halides include hafnium fluorides, hafnium chlorides, hafnium bromides, and hafnium iodides.

Among them, hafnium oxoacids and hafnium halides are preferable, hafnium sulfates and hafnium chlorides are more preferable, in terms of high solubility in various solvents.

The hafnium chlorides are not particularly limited and may be appropriately selected depending on the intended purpose. Examples of the hafnium chlorides include anhydrous hafnium chlorides and hafnium chloride tetrahydrofuran complexes.

These hafnium-including compounds may be synthesized or may be commercially available products.

<<Bismuth-Including Compound>>

Bismuth (Bi) belongs to the A element.

The bismuth-including compound belongs to the A element-including compound.

The bismuth-including compound is not particularly limited and may be appropriately selected depending on the intended purpose. Examples of the bismuth-including compound include organic bismuth compounds and inorganic bismuth compounds.

—Organic Bismuth Compound—

The organic bismuth compounds are not particularly limited and may be appropriately selected depending on the intended purpose, so long as the organic bismuth compounds are compounds each including bismuth and an organic group. The bismuth and the organic group are bound via, for example, an ionic bond, a covalent bond, or a coordination bond.

The organic group is not particularly limited and may be appropriately selected depending on the intended purpose. Examples of the organic group include an alkoxy group that may have a substituent, an acyloxy group that may have a substituent, and an acetylacetonato group that may have a substituent. Examples of the alkoxy group include an alkoxy group including 1 through 6 carbon atoms. Examples of the acyloxy group include an acyloxy group including 1 through 10 carbon atoms.

Examples of the substituent include halogen and a tetrahydrofuryl group.

Examples of the organic bismuth compounds include triphenylbismuth, bismuth 2-ethylhexanoate, and bismuth acetylacetonato.

—Inorganic Bismuth Compound—

The inorganic bismuth compounds are not particularly limited and may be appropriately selected depending on the intended purpose. Examples of the inorganic bismuth compounds include bismuth oxolates, bismuth halides, and bismuth hydroxides.

Examples of the bismuth oxolates include bismuth nitrates, bismuth sulfates, and bismuth acetates.

Examples of the bismuth halides include bismuth fluorides, bismuth chlorides, bismuth bromides, and bismuth iodides.

Among them, bismuth oxolates and bismuth halides are preferable, bismuth nitrates and bismuth chlorides are more preferable in terms of high solubility in various solvents.

The bismuth nitrate is not particularly limited and may be appropriately selected depending on the intended purpose. Examples of the bismuth nitrate include bismuth nitrate hydrates. Examples of the bismuth nitrate hydrates include bismuth nitrate pentahydrates.

The bismuth sulfate is not particularly limited and may be appropriately selected depending on the intended purpose. Examples of the bismuth sulfate include anhydrous bismuth sulfates.

The bismuth chloride is not particularly limited and may be appropriately selected depending on the intended purpose. Examples of the bismuth chloride include anhydrous bismuth chlorides.

These bismuth-including compounds may be synthesized or may be commercially available products.

<<Titanium-Including Compound>>

Titanium (Ti) belongs to the B element.

The titanium-including compound belongs to the B element-including compound.

The titanium-including compound is not particularly limited and may be appropriately selected depending on the intended purpose. Examples of the titanium-including compound include organic titanium compounds and inorganic titanium compounds.

—Organic Titanium Compound—

The organic titanium compounds are not particularly limited and may be appropriately selected depending on the intended purpose, so long as the organic titanium compounds are compounds each including titanium and an organic group. The titanium and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic indium compound.

Examples of the organic titanium compounds include titanium 2-ethylhexanoate, titanium isopropoxide, and titanium acetylacetonato.

—Inorganic Titanium Compound—

The inorganic titanium compounds are not particularly limited and may be appropriately selected depending on the intended purpose. Examples of the inorganic titanium compounds include titanium oxoacids and titanium halides.

Examples of the titanium oxoacids include titanium sulfates and titanium sulfate oxides.

Examples of the titanium halides include titanium fluorides, titanium chlorides, titanium bromides, and titanium iodides.

Among them, titanium oxoacids and titanium halides are preferable, titanium sulfates and titanium chlorides are more preferable, in terms of high solubility in various solvents.

The titanium sulfates are not particularly limited and may be appropriately selected depending on the intended purpose. Examples of the titanium sulfates include titanium sulfate anhydrides.

The titanium chlorides are not particularly limited and may be appropriately selected depending on the intended purpose. Examples of the titanium chlorides include anhydrous titanium chlorides.

These titanium-including compounds may be synthesized or may be commercially available products.

As described above, the compounds including scandium (Sc), yttrium (Y), lanthanoid [lanthanum (La), cerium (Ce), and lutetium (Lu)], zirconium (Zr), hafnium (Hf), bismuth (Bi), and titanium (Ti) have been described in detail. The same description is applicable to, for example, antimony (Sb), tellurium (Te), and gallium (Ga).

The C element is at least one selected from the group consisting of Be, Mg, Ca, Sr, Ba, and Ra.

The C element-including compound includes the C element.

Examples of the C element-including compound include inorganic salts, oxides, hydroxides, organic acid salts, metal alkoxides, organometallics, and metal complexes.

Examples of the C element-including compound include organic alkaline earth metal compounds and inorganic alkaline earth metal compounds. Examples of the alkaline earth metals in the alkaline earth metal-including compounds include Mg (magnesium), Ca (calcium), Sr (strontium), Ba (barium), and Ra (radium).

—Organic Alkaline Earth Metal Compound—

The organic alkaline earth metal compounds are not particularly limited and may be appropriately selected depending on the intended purpose, so long as the organic alkaline earth metal compounds are compounds each including an alkaline earth metal and an organic group. The alkaline earth metal and the organic group are bound via, for example, an ionic bond, a covalent bond, or a coordination bond.

The organic group is not particularly limited and may be appropriately selected depending on the intended purpose. Examples of the organic group include the organic groups as exemplified in the description of the organic scandium compound.

Examples of the organic alkaline earth metal compounds include magnesium methoxide, magnesium ethoxide, diethyl magnesium, magnesium acetate, magnesium formate, acetylacetone magnesium, magnesium 2-ethylhexanoate, magnesium lactate, magnesium naphthenate, magnesium citrate, magnesium salicylate, magnesium benzoate, magnesium oxalate, magnesium trifluoromethanesulfonate, calcium methoxide, calcium ethoxide, calcium acetate, calcium formate, acetylacetone calcium, calcium dipivaloylmethanato, calcium 2-ethylhexanoate, calcium lactate, calcium naphthenate, calcium citrate, calcium salicylate, calcium neodecanoate, calcium benzoate, calcium oxalate, strontium isopropoxide, strontium acetate, strontium formate, acetylacetone strontium, strontium 2-ethylhexanoate, strontium lactate, strontium naphthenate, strontium neodecanoate, strontium salicylate, strontium oxalate, barium ethoxide, barium isopropoxide, barium acetate, barium formate, acetylacetone barium, barium 2-ethylhexanoate, barium lactate, barium naphthenate, barium neodecanoate, barium oxalate, barium benzoate, and barium trifluoromethanesulfonate.

—Inorganic Alkaline Earth Metal Compound—

Examples of the inorganic alkaline earth metal compounds include alkaline earth metal nitrates, alkaline earth metal sulfates, alkaline earth metal chlorides, alkaline earth metal fluorides, alkaline earth metal bromides, and alkaline earth metal iodides.

Examples of the alkaline earth metal nitrates include magnesium nitrate, calcium nitrate, strontium nitrate, and barium nitrate.

Examples of the alkaline earth metal sulfates include magnesium sulfate, calcium sulfate, strontium sulfate, and barium sulfate.

Examples of the alkaline earth metal chlorides include magnesium chloride, calcium chloride, strontium chloride, and barium chloride.

Examples of the alkaline earth metal fluorides include magnesium fluoride, calcium fluoride, strontium fluoride, and barium fluoride.

Examples of the alkaline earth metal bromides include magnesium bromide, calcium bromide, strontium bromide, and barium bromide.

Examples of the alkaline earth metal iodides include magnesium iodide, calcium iodide, strontium iodide, and barium iodide.

The C element-including compounds may be synthesized or may be commercially available products.

<<Solvent>>

The solvent is not particularly limited and may be appropriately selected depending on the intended purpose. Examples of the solvent include water, organic solvents, and inorganic acids. Among them, organic solvents are preferable.

<<<Organic Solvent>>>

The organic solvent may be appropriately selected depending on the intended purpose, but is preferably at least one selected from the group consisting of organic acids, organic acid esters, aromatic compounds, diols, glycol ethers, polar aprotic solvents, alkane compounds, alkene compounds, ether compounds, and alcohols.

—Organic Acid—

The organic acid may be appropriately selected depending on the intended purpose. Preferable examples of the organic acid include acetic acid, lactic acid, propionic acid, octanoic acid, neodecanoic acid, and derivatives thereof.

These may be used alone or in combination.

—Organic Acid Ester—

The organic acid ester may be appropriately selected depending on the intended purpose. Preferable examples of the organic acid ester include methyl lactate, propyl propionate, and derivatives thereof.

These may be used alone or in combination.

—Aromatic Compound—

The aromatic compound may be appropriately selected depending on the intended purpose. Preferable examples of the aromatic compound include xylene, mesitylene, tetralin, and derivatives thereof.

These may be used alone or in combination.

—Diol—

The diols may be appropriately selected depending on the intended purpose. However, alkanediol and dialkylene glycol are preferable. The diol preferably includes 2 through 6 carbon atoms. The diol is preferably at least one selected from the group consisting of diethylene glycol, 1,2-ethanediol, 1,2-propanediol, and 1,3-butanediol.

These may be used alone or in combination.

—Glycol Ether—

The glycol ether may be appropriately selected depending on the intended purpose, but is preferably alkylene glycol monoalkyl ether. The number of carbon atoms of the glycol ether is preferably from 3 through 8.

The alkylene glycol monoalkyl ether is preferably at least one selected from the group consisting of ethylene glycol monomethyl ether, ethylene glycol monoethyl ether, ethylene glycol monopropyl ether, ethylene glycol monobutyl ether, propylene glycol-1-monomethyl ether, and propylene glycol-1-monobutyl ether. These alkylene glycol monoalkyl ethers have a boiling point of from about 120° C. through about 180° C., which makes it possible to achieve a relatively low baking temperature and a short baking time. Also, after the baking, the oxide or oxynitride insulator film including less impurities such as carbon and organic matters can be obtained.

These may be used alone or in combination.

—Aprotic Polar Solvent—

The polar aprotic solvent favorably dissolves material compounds and has high stability after dissolution. Therefore, when the aprotic polar solvent is used in the coating liquid for forming an oxide or oxynitride insulator film, the oxide insulator film or the oxynitride insulator film having high uniformity and less defects can be obtained.

The aprotic polar solvent may be appropriately selected depending on the intended purpose. Preferable examples of the polar aprotic solvent include isophorone, propylene carbonate, dihydrofuran-2(3H)-one(γ-butyrolactone), dimethylformamide, dimethylacetamide, 1,3-dimethyl-2-imidazolidinone, and derivatives thereof.

These may be used alone or in combination.

—Alkane Compound—

The alkane compound may be appropriately selected depending on the intended purpose. For example, n-nonane, decane, tetradecane, decalin, and derivatives thereof are preferable.

These may be used alone or in combination.

—Alkene Compound—

The alkene compound may be appropriately selected depending on the intended purpose. For example, 1-dodecene, 1-tetradecene, and derivatives thereof are preferable.

These may be used alone or in combination.

—Ether Compound—

The ether compound may be appropriately selected depending on the intended purpose. For example, benzofuran, polyethylene glycol, and derivatives thereof are preferable.

These may be used alone or in combination.

—Alcohol—

The alcohol is not particularly limited and may be appropriately selected depending on the intended purpose, so long as the alcohol has 4 or more carbon atoms. Examples thereof include 1-butanol, cyclopentanol, 2-hexanol, and derivatives thereof.

These may be used alone or in combination.

<<<Inorganic Acid>>>

The inorganic acid may be appropriately selected depending on the intended purpose. Examples thereof include sulfuric acid, nitric acid, hydrochloric acid, phosphoric acid, and hydrofluoric acid.

These may be used alone or in combination.

They can improve the inorganic salt in solubility.

Regarding the coating liquid for forming an oxide or oxynitride insulator film, the A element-including compound, the B element-including compound, and the C element-including compound are preferably dissolved in the solvent.

<Method for Preparing Coating Liquid for Forming an Oxide or Oxynitride Insulator Film>

A method for preparing the coating liquid for forming an oxide or oxynitride insulator film is not particularly limited and may be appropriately selected depending on the intended purpose. Examples thereof include a method by mixing a compound including each element or a solution thereof and the solvent at a predetermined rate.

The coating liquid of the present disclosure for forming an oxide or oxynitride insulator film is suitable for a coating liquid for preparing the oxide insulator film or the oxynitride insulator film. Particularly, the coating liquid for preparing oxide or oxynitride insulator film satisfying the Formula (1) or the Formula (2) is suitable for a coating liquid for producing the gate insulating layer of a field-effect transistor.

(Oxide or Oxynitride Insulator Film)

One aspect of an oxide or oxynitride insulator film of the present disclosure is obtained by coating the coating liquid of the present disclosure for forming an oxide or oxynitride insulator film on an object to be coated, and drying, followed by baking.

One aspect of an oxide or oxynitride insulator film of the present disclosure is a baked product of the coating liquid of the present disclosure for forming an oxide or oxynitride insulator film.

The oxide or oxynitride insulator film can be obtained by, for example, a method of the present disclosure for producing an oxide or oxynitride insulator film as described below.

(Method for Producing Oxide or Oxynitride Insulator Film)

In a method of the present disclosure for producing an oxide or oxynitride insulator film, the coating liquid of the present disclosure for forming an oxide or oxynitride insulator film is coated on an object to be coated, and is dried, followed by baking.

When the coating liquid for forming an oxide or oxynitride insulator film satisfying the Formula (1) or the Formula (2) is used as the coating liquid for forming an oxide or oxynitride insulator film, it is possible to obtain the oxide insulator film or the oxynitride insulator film, which is particularly suitable for the gate insulating layer of a field-effect transistor.

The object to be coated is not particularly limited and may be appropriately selected depending on the intended purpose. Examples of the object to be coated include glass substrates and plastic substrates.

When the oxide insulator film or the oxynitride insulator film is used in the active layer of the field-effect transistor, one example of the object to be coated is, for example, a substrate or an active layer. A shape, a structure, and a size of the substrate are not particularly limited and may be appropriately selected depending on the intended purpose. The material of the substrate is not particularly limited and may be appropriately selected depending on the intended purpose. Examples of the material include glass substrates and plastic substrates.

A method for the coating is not particularly limited and may be appropriately selected depending on the intended purpose. Examples of the method include the screen printing method, the roll coating method, the dip-coating method, the spin coating method, the die coating method, the inkjet method, and the nanoimprint method. Among them, the spin coating method and the die coating method are preferable because these methods are easily combined with the existing photolithography techniques.

The drying is not particularly limited and may be appropriately selected depending on the intended purpose, so long as a volatile component in the coating liquid for forming an oxide or oxynitride insulator film can be removed. Note that, in the drying, it is unnecessary to completely remove the volatile component, and the volatile component may be removed in such a degree that the baking is not inhibited.

A temperature of the baking is not particularly limited and may be appropriately selected depending on the intended purpose, so long as the temperature is equal to or higher than a temperature at which the metal elements included in the present coating liquid form oxides, and the temperature is equal to or lower than a temperature at which the substrate (object to be coated) is deformed by heat. The temperature of the baking is preferably from 150° C. through 600° C.

An atmosphere of the baking is not particularly limited and may be appropriately selected depending on the intended purpose. For example, an oxygen-including atmosphere (e.g., in oxygen and in the air) is preferable. This makes it possible to oxidize and gasify organic matters and anions included in the compounds of the metal elements or the solvent to thereby remove them from the film. Moreover, when the coating liquid is baked under an atmosphere including nitrogen (e.g., in nitrogen and in an ammonia vapor), it is possible to incorporate nitrogen into the film to form the oxynitride film. As a result, the film properties such as relative permittivity and thermal expansion coefficient can be controlled.

Time for the baking is not particularly limited and may be appropriately selected depending on the intended purpose.

An average thickness of the oxide insulator film or the oxynitride insulator film formed is not particularly limited and may be appropriately selected depending on the intended purpose. The average thickness is preferably from 1 nm through 500 nm, more preferably from 10 nm through 300 nm, particularly preferably from 50 nm through 200 nm.

The oxide or oxynitride insulator film formed has no optical absorption band resulting from the electron transition in the visible light region or the near-infrared region. Due to, for example, the surface roughness on the surface of the present insulator film and the interface with the adjacent layer or the substrate and the difference of the refractive index between them, light scattering possibly causes reduction of the optical transmittance. However, it is intrinsically transparent. Note that, a narrow absorption band resulting from the f-f transition of lanthanoid elements may be allowed to exist.

(Field-Effect Transistor)

A field-effect transistor of the present disclosure includes at least a gate electrode, a source electrode, a drain electrode, an active layer, and a gate insulating layer, and further includes other components such as an interlayer dielectric if necessary.

The field-effect transistor of the present disclosure can be produced, for example, by a method of the present disclosure for producing a field-effect transistor, which will be described hereinafter.

<Gate Electrode>

The gate electrode is not particularly limited and may be appropriately selected depending on the intended purpose, so long as the gate electrode is an electrode to which gate voltage is to be applied.

A material of the gate electrode is not particularly limited and may be appropriately selected depending on the intended purpose. Examples of the material include metals (e.g., platinum, palladium, gold, silver, copper, zinc, aluminum, nickel, chromium, tantalum, molybdenum, and titanium), alloys thereof, and mixtures these metals. Moreover, examples of the material include electrically conductive oxides (e.g., indium oxide, zinc oxide, tin oxide, gallium oxide, and niobium oxide), complex compounds thereof, and mixtures thereof.

An average thickness of the gate electrode is not particularly limited and may be appropriately selected depending on the intended purpose, and is preferably from 40 nm through 2 µm, more preferably from 70 nm through 1 µm.

<Gate Insulating Layer>

In one aspect, the gate insulating layer is an oxide or oxynitride insulator formed between the gate electrode and the active layer and is formed of the oxide insulator film or the oxynitride insulator film formed by coating the coating liquid of the present disclosure for forming an oxide or oxynitride insulator film.

Moreover, in another aspect, the gate insulating layer is a gate insulating layer formed of the oxide or oxynitride insulator film, which is formed between the gate electrode and the active layer, and is the oxide or oxynitride insulator film of the present disclosure.

An average thickness of the gate insulating layer is not particularly limited and may be appropriately selected depending on the intended purpose. However, the average thickness is preferably from 10 nm through 1 µm, more preferably from 30 nm through 300 nm.

<Source Electrode and Drain Electrode>

The source electrode and the drain electrode are not particularly limited and may be appropriately selected depending on the intended purpose.

A material of the source electrode and a material of the drain electrode are not particularly limited and may be appropriately selected depending on the intended purpose. Examples of these materials include the same materials as the materials exemplified in the description of the gate electrode.

An average thickness of the source electrode and the drain electrode is not particularly limited and may be appropriately selected depending on the intended purpose, and is preferably from 40 nm through 2 µm, more preferably from 70 nm through 1 µm.

<Active Layer>

The active layer is an active layer formed of a semiconductor, which is formed between the source electrode and the drain electrode. The semiconductor is not particularly limited and may be appropriately selected depending on the intended purpose. Examples of the semiconductor include silicon semiconductors and oxide semiconductors. Among them, oxide semiconductors are particularly preferable.

Examples of the silicon semiconductors include amorphous silicon and polycrystal silicon.

Examples of the oxide semiconductors include InGa—Zn—O, In—Zn—O, and In—Mg—O.

An average thickness of the active layer is not particularly limited and may be appropriately selected depending on the intended purpose, but is preferably from 1 nm through 200 nm, more preferably from 5 nm through 100 nm.

Figure 2:
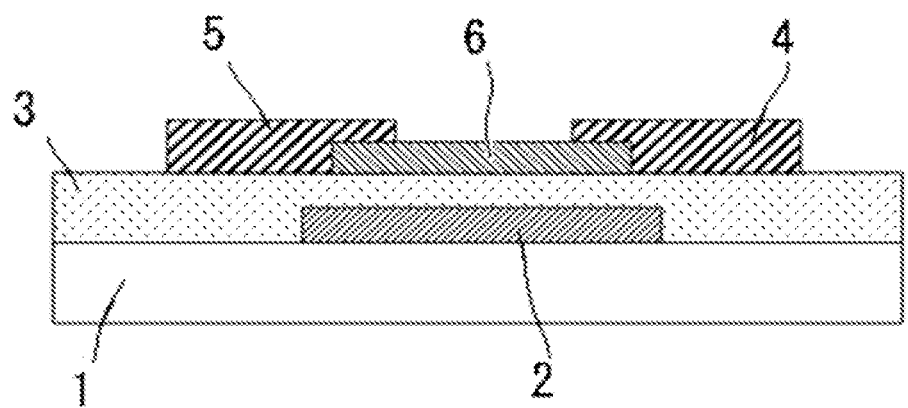
FIG. 2 is a schematic structural view illustrating one example of a bottom gate/top contact field-effect transistor.
Figure 3:
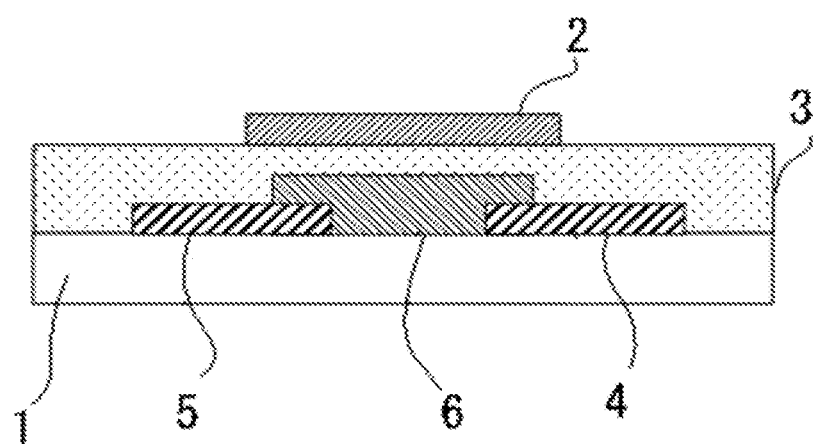
FIG. 3 is a schematic structural view illustrating one example of a top gate/bottom contact field-effect transistor.
Figure 4:
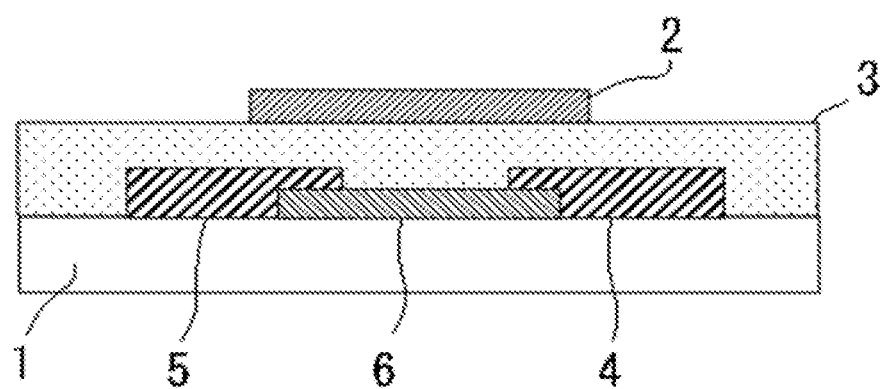
FIG. 4 is a schematic structural view illustrating one example of a top gate/top contact field-effect transistor.

A structure of the field-effect transistor is not particularly limited and may be appropriately selected depending on the intended purpose. Examples of the structure include a bottom gate/bottom contact field-effect transistor (FIG. 1), a bottom gate/top contact field-effect transistor (FIG. 2), a top gate/bottom contact field-effect transistor (FIG. 3), and a top gate/top contact field-effect transistor (FIG. 4).

Here, in FIGS. 1 to 4, the reference numeral 1 denotes a substrate, the reference numeral 2 denotes a gate electrode, the reference numeral 3 denotes a gate insulating layer, the reference numeral 4 denotes a source electrode, the reference numeral 5 denotes a drain electrode, and the reference numeral 6 denotes an active layer.

The field-effect transistor of the present disclosure can be suitably used for field-effect transistors for logic circuits and pixel drive circuits such as liquid crystal displays, organic EL displays, and electrochromic displays.

(Method for Producing Field-Effect Transistor)

A method of the present disclosure for producing a field-effect transistor (first production method) includes:
a step of forming a gate electrode;
a step of forming a gate insulating layer on the gate electrode;
a step of forming a source electrode and a drain electrode on the gate insulating layer to be spaced from each other; and
a step of forming an active layer on the gate insulating layer and in a channel region between the source electrode and the drain electrode, the active layer being formed of a semiconductor.

A method of the present disclosure for producing a field-effect transistor (second production method) includes:
a step of forming a source electrode and a drain electrode to be spaced from each other;
a step of forming an active layer on the substrate and in a channel region between the source electrode and the drain electrode, the active layer being formed of a semiconductor;
a step of forming a gate insulating layer on the active layer; and
a step of forming a gate electrode on the gate insulating layer.

A method of the present disclosure for producing a field-effect transistor (third production method) includes:
a step of forming an active layer formed of a semiconductor;
a step of forming a gate insulating layer on the active layer;
a step of forming a gate electrode on the gate insulating layer;
a step of forming an interlayer dielectric on the gate electrode layer;
a step of forming through holes in the gate insulating layer or the interlayer dielectric; and
a step of forming a source electrode and a drain electrode on the interlayer dielectric.

<First Production Method>

The first production method will be described hereinafter.

—Step of Forming Gate Electrode—

The step of forming a gate electrode is not particularly limited and may be appropriately selected depending on the intended purpose, so long as the step is a step of forming a gate electrode. Examples of the step include (i) a step of forming a gate electrode by forming a film through, for example, the sputtering method or the dip coating method and then patterning the film through photolithography; and (ii) a step of forming a gate electrode by directly forming a film having a desired shape through the printing process, such as inkjet printing, nanoimprinting, or gravure printing.

The gate electrode is formed on a substrate, for example.

A shape, a structure, and a size of the substrate are not particularly limited and may be appropriately selected depending on the intended purpose.

The substrate is not particularly limited and may be appropriately selected depending on the intended purpose. Examples of the substrate include glass substrates and plastic substrates.

A material of the glass substrate is not particularly limited and may be appropriately selected depending on the intended purpose. Examples of the material include alkali-free glass and silica glass.

A material of the plastic substrate is not particularly limited and may be appropriately selected depending on the intended purpose. Examples of the material include polycarbonate (PC), polyimide (PI), polyethylene terephthalate (PET), and polyethylene naphthalate (PEN).

Note that, the substrate is preferably subjected to a pre-treatment (e.g., oxygen plasma, UV-ozone, and washing through UV irradiation) in order to wash the surface of the substrate and to improve close adhesiveness.

—Step of Forming Gate Insulating Layer—

The step of forming a gate insulating layer is not particularly limited and may be appropriately selected depending on the intended purpose, so long as it is a step of forming a gate insulating layer formed of an oxide insulator or an oxynitride insulator, the gate insulating layer being obtained by coating the coating liquid of the present disclosure for forming an oxide or oxynitride insulator film on the gate electrode.

In the step of forming a gate insulating layer, at least one of relative permittivity, a crystal phase, and a crystallization temperature of the oxide or oxynitride insulator is preferably controlled by adjusting a total number of atoms of the A element (NA), a total number of atoms of the B element (NB), and a total number of atoms of the C element (NC) in the coating liquid for forming an oxide or oxynitride insulator film. This makes it possible to obtain a field-effect transistor having desired properties (e.g., threshold voltage).

Preferably, in the step of forming a gate insulating layer, the coating liquid for forming an oxide or oxynitride insulator film includes the organic solvent and a viscosity of the coating liquid for forming an oxide or oxynitride insulator film is controlled by adjusting a mixing ratio of the organic solvent in the coating liquid for forming an oxide or oxynitride insulator film. In addition, in order to obtain a desired film thickness, a desired shape of the surface, desired coating properties, it is possible to add another solvent to the coating liquid or adjust the concentration. This makes it possible to obtain a field-effect transistor excellent in coating property and having a favorable film-forming state.

A method for forming an oxide insulator or an oxynitride insulator by coating the coating liquid for forming an oxide or oxynitride insulator film is not particularly limited and may be appropriately selected depending on the intended purpose. Examples of the method include a method for forming an oxide insulator or an oxynitride insulator by coating the coating liquid for forming an oxide or oxynitride insulator film on the substrate formed on the gate electrode layer and then drying and baking the coating liquid.

A method of the coating is not particularly limited and may be appropriately selected depending on the intended purpose. Examples of the method include the screen printing method, the roll coating method, the dip-coating method, the spin coating method, the die coating method, the inkjet method, and the nanoimprint method. Among them, the spin coating method and the die coating method are preferable because these methods are easily combined with the existing photolithography techniques in the production of the field-effect transistor.

The drying is not particularly limited and may be appropriately selected depending on the intended purpose, so long as a volatile component in the coating liquid for forming an oxide or oxynitride insulator film can be removed. Note that, in the drying, it is unnecessary to completely remove the volatile component, and the volatile component may be removed in such a degree that the baking is not inhibited.

A temperature of the baking is not particularly limited and may be appropriately selected depending on the intended purpose. The temperature of the baking is preferably from 150° C. through 600° C.

—Step of Forming Source Electrode and Drain Electrode—

The step of forming a source-drain electrode is not particularly limited and may be appropriately selected depending on the intended purpose, so long as the step is a step of forming the source electrode and the drain electrode on the gate insulating layer to be spaced from each other. Examples of the step include (i) a step of forming a source electrode and a drain electrode by forming a film through, for example, the sputtering method or the dip coating method and then patterning the film through photolithography; and (ii) a step of forming a source electrode and a drain electrode by directly forming a film having a desired shape through the printing process, such as inkjet printing, nanoimprinting, or gravure printing.

—Step of Forming Active Layer—

The step of forming an active layer is not particularly limited and may be appropriately selected depending on the intended purpose, so long as the step is a step of forming an active layer formed of a semiconductor on the gate insulating layer and in a channel region between the source electrode and the drain electrode. Examples of the step include (i) a step of forming an active layer by forming a film through, for example, the sputtering method or the dip coating method and then patterning the film through photolithography; and (ii) a step of forming an active layer by directly forming a film having a desired shape through the printing process, such as inkjet printing, nanoimprinting, or gravure printing.

In the first production method, the step of forming the source electrode and the drain electrode and the step of forming the active layer may be performed in any order. The step of forming the active layer may be performed after the step of forming the source electrode and the drain electrode, and the step of forming the source electrode and the drain electrode may be performed after the step of forming the active layer.

In the first production method, when the step of forming the active layer is performed after the step of forming the source electrode and the drain electrode, a bottom gate/bottom contact field-effect transistor can be produced.

In the first production method, the step of forming the source electrode and the drain electrode is performed after the step of forming the active layer, a bottom gate/top contact field-effect transistor can be produced.

Here, a method for producing a bottom gate/bottom contact field-effect transistor will be described with reference to FIGS. 5A to 5D.

Figure 5A:
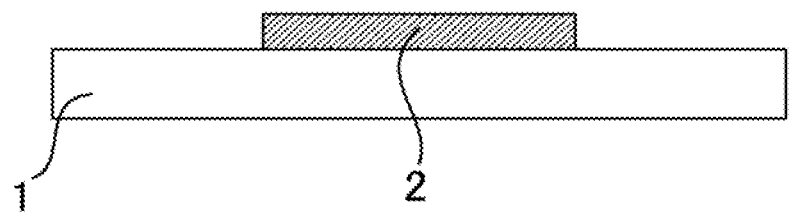
FIG. 5A is a view illustrating one example of a method for producing a field-effect transistor of the present disclosure (part 1)

First, a conductor film made of, for example, aluminum is formed on a substrate 1 made of, for example, a glass substrate through, for example, the sputtering method. Then, the thus-formed conductor film is patterned through photolithography to form a gate electrode 2 (FIG. 5A).

Figure 5B:
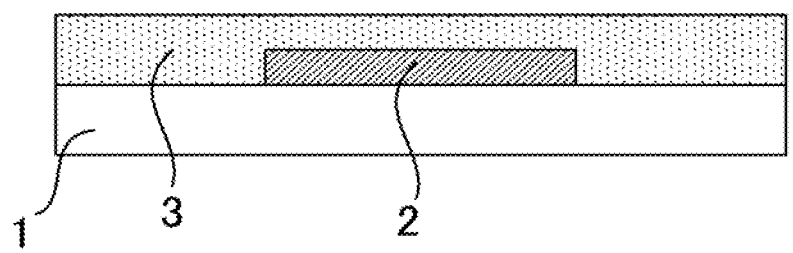
FIG. 5B is a view illustrating one example of a method for producing a field-effect transistor of the present disclosure (part 2)

Next, the coating liquid for forming an oxide or oxynitride insulator film is coated on the gate electrode 2 and the substrate 1 through the spin coating method so as to cover the gate electrode 2. The coating liquid is subjected to a heat treatment to form a gate insulating layer 3 formed of the oxide or oxynitride insulator (FIG. 5B).

Figure 5C:
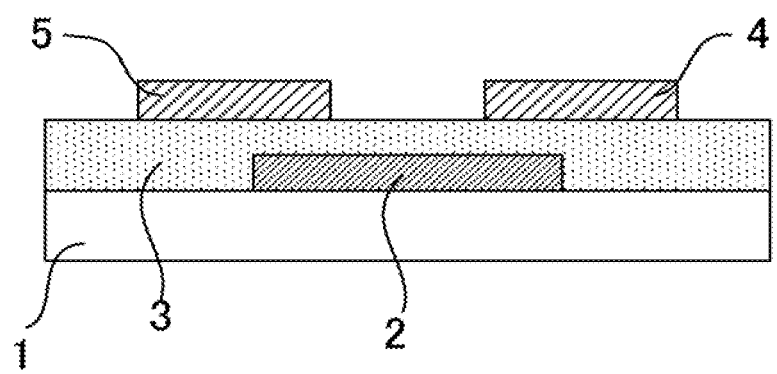
FIG. 5C is a view illustrating one example of a method for producing a field-effect transistor of the present disclosure (part 3)

Then, a conductor film formed of, for example, ITO is formed on the gate insulating layer 3 through, for example, the sputtering method. The thus-formed conductor film is patterned through the etching to form a source electrode 4 and a drain electrode 5 (FIG. 5C).

Figure 5D:
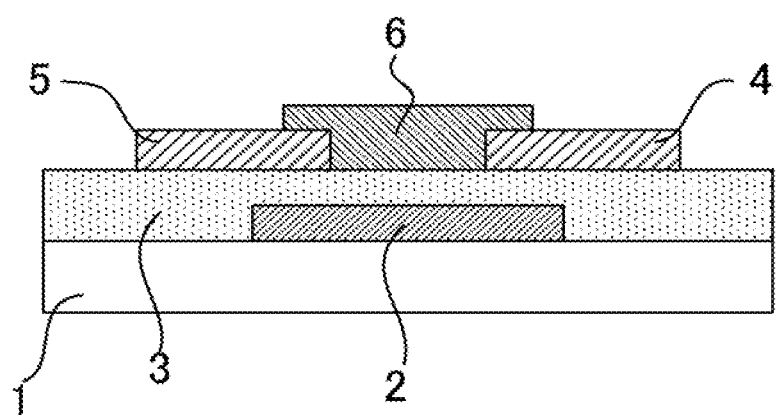
FIG. 5D is a view illustrating one example of a method for producing a field-effect transistor of the present disclosure (part 4)

Then, a semiconductor film formed of, for example, IGZO is formed on the gate insulating layer 3 through, for example, the sputtering method so as to cover a channel region formed between the source electrode 4 and the drain electrode 5. The semiconductor film formed is patterned through etching to form an active layer 6 (FIG. 5D).

As described above, a field-effect transistor is produced.

<Second Production Method>

The second production method will be described hereinafter.

—Step of Forming Source Electrode and Drain Electrode—

A step of forming the source electrode and the drain electrode is not particularly limited and may be appropriately selected depending on the intended purpose, so long as the step is a step of forming a source electrode and a drain electrode to be spaced from each other. Examples of the step include the same step as the step exemplified in the description of the step of forming the source electrode and the drain electrode in the first production method.

The gate electrode is formed on a substrate, for example.

The substrate is not particularly limited and may be appropriately selected depending on the intended purpose. Examples of the substrate include the same substrates as the substrates exemplified in the description of the first production method.

—Step of Forming Active Layer—

The step of forming an active layer is not particularly limited and may be appropriately selected depending on the intended purpose, so long as the step is a step of forming an active layer formed of a semiconductor on the gate insulating layer and in a channel region between the source electrode and the drain electrode. Examples of the step include (i) a step of forming an active layer by forming a film through, for example, the sputtering method or the dip coating method and then patterning the film through photolithography; and (ii) a step of forming an active layer by directly forming a film having a desired shape through the printing process, such as inkjet printing, nanoimprinting, or gravure printing.

—Step of Forming Gate Insulating Layer—

The step of forming a gate insulating layer is not particularly limited and may be appropriately selected depending on the intended purpose, so long as the step is a step of forming a gate insulating layer formed of an oxide insulator or an oxynitride insulator by coating the coating liquid of the present disclosure for forming an oxide or oxynitride insulator film on the gate electrode.

—Step of Forming Gate Electrode—

A step of forming the gate electrode is not particularly limited and may be appropriately selected depending on the intended purpose, so long as the step of forming the gate electrode is a step of forming a gate electrode on the gate insulating layer. Examples of the step include the same step as the step exemplified in the description of the step of forming the gate electrode of the first production method.

In the second production method, the step of forming the source electrode and the drain electrode and the step of forming the active layer may be performed in any order. The step of forming the active layer may be performed after the step of forming the source electrode and the drain electrode, and the step of forming the source electrode and the drain electrode may be performed after the step of forming the active layer.

In the second production method, when the step of forming the active layer is performed after the step of forming the source electrode and the drain electrode, a top gate/bottom contact field-effect transistor can be produced.

In the second production method, the step of forming the source electrode and the drain electrode is performed after the step of forming the active layer, a top gate/top contact field-effect transistor can be produced.

<Third Production Method>

The third production method will be described hereinafter.

—Step of Forming Active Layer—

The step of forming an active layer is not particularly limited and may be appropriately selected depending on the intended purpose, so long as the step is a step of forming an active layer on the gate insulating layer and in a channel region between the source electrode and the drain electrode. Examples of the step include (i) a step of forming an active layer by forming a film through, for example, the sputtering method or the dip coating method and then patterning the film through photolithography; and (ii) a step of forming an active layer by directly forming a film having a desired shape through the printing process, such as inkjet printing, nanoimprinting, or gravure printing.

—Step of Forming Gate Insulating Layer—

The step of forming a gate insulating layer is not particularly limited and may be appropriately selected depending on the intended purpose, so long as the step is a step of forming a gate insulating layer formed of the oxide insulator or the oxynitride insulator by coating the coating liquid of the present disclosure for forming an oxide or oxynitride insulator film on the gate electrode.

—Step of Forming Gate Electrode—

The step of forming the gate electrode is not particularly limited and may be appropriately selected depending on the intended purpose, so long as the step is a step of forming the gate electrode on the gate insulating layer. Examples of the step include the same step as the step exemplified in the description of the step of the forming the gate electrode in the first production method.

—Step of Forming Interlayer Dielectric—

The step of forming an interlayer dielectric is not particularly limited and may be appropriately selected depending on the intended purpose, so long as the step is a step of forming the interlayer dielectric on the gate insulating layer and the gate electrode. Examples of the step of forming an interlayer dielectric include (i) a step of forming an interlayer dielectric by forming a film through, for example, the sputtering method, the CVD method, or the spin coating method and then patterning the film through photolithography; and (ii) a step of forming an interlayer dielectric by directly forming a film having a desired shape through the printing process, such as inkjet printing, nanoimprinting, or gravure printing. In order to provide electrical connection between the active layer and the source/drain electrodes in the subsequent step, through holes are provided in the interlayer dielectric film of the connection region (see details of the step of forming through holes that will be described hereinafter) in this step.

A material of the interlayer dielectric is not particularly limited and may be appropriately selected depending on the intended purpose. Examples of the material include inorganic insulating materials and organic insulating materials.

Examples of the inorganic insulating materials include silicon oxide, aluminum oxide, tantalum oxide, titanium oxide, yttrium oxide, lanthanum oxide, hafnium oxide, zirconium oxide, silicon nitride, aluminum nitride, and mixtures thereof.

Examples of the organic insulating materials include polyimide, polyamide, polyacrylate, polyvinyl alcohol, and novolak resins.

An average thickness of the interlayer dielectric is not particularly limited and may be appropriately selected depending on the intended purpose. However, the average thickness is preferably from 30 nm through 3 μm, more preferably from 100 nm through 1 μm.

—Step of Forming Through Holes—

The step of forming through holes is not particularly limited and may be appropriately selected depending on the intended purpose, so long as the step is a step of forming through holes in at least one of the gate insulating layer and the interlayer dielectric.

The through holes are formed so as to reach the active layer.

The through holes are holes for contact of the source electrode and the drain electrode formed on the interlayer dielectric with the active layer.

At least two through holes are formed corresponding to the source electrode and the drain electrode.

—Step of Forming Source Electrode and Drain Electrode—

The step of forming a source electrode and a drain electrode is not particularly limited and may be appropriately selected depending on the intended purpose, so long as the step is a step of forming the source electrode and the drain electrode to be spaced from each other. Examples of the step include the same step as the step exemplified in the description of the step of forming a source electrode and a drain electrode of the first production method. In this step, electrical connection between the active layer and the source/drain electrodes is provided.

Figure 6:
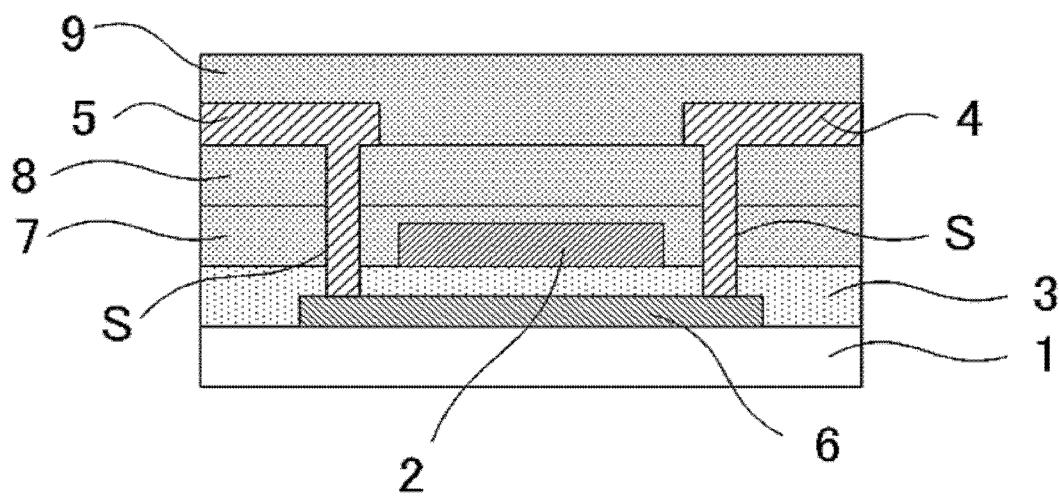
FIG. 6 is a schematic structural view illustrating one example of a top gate/ILD field-effect transistor.

One example of the field-effect transistor produced in the third production method is presented in FIG. 6.

The field-effect transistor presented in FIG. 6 is a top gate/ILD field-effect transistor.

In FIG. 6, the reference numeral 1 denotes a substrate, the reference numeral 2 denotes a gate electrode, the reference numeral 3 denotes a gate insulating layer, the reference numeral 4 denotes a source electrode, the reference numeral 5 denotes a drain electrode, the reference numeral 6 denotes an active layer, the reference numeral 7 denotes first interlayer dielectric, the reference numeral 8 denotes a second interlayer dielectric, the reference numeral 9 denotes a third interlayer dielectric, and the symbol S denotes through holes.

(Semiconductor Element)

One aspect of a semiconductor element of the preset disclosure includes the oxide or oxynitride insulator film of the present disclosure.

Another aspect of a semiconductor element of the present disclosure includes the oxide or oxynitride insulator film of the present disclosure in the insulator layer.

Examples of the semiconductor element include a diode, a field-effect transistor, a light emitting element, and a photoelectric converting element.

<Diode>

The diode is not particularly limited and may be appropriately selected depending on the intended purpose. Examples of the diode include a diode including a first electrode, a second electrode, the active layer formed between the first electrode and the second electrode, and the insulator layer. Examples of the aforementioned diode include a PIN photodiode.

—PN Junction Diode—

The PN junction diode includes at least the active layer and the insulator film, and further includes the other components such as an anode (positive electrode) and a cathode (negative electrode) if necessary.

—Active Layer—

The active layer includes at least a p-type semiconductor layer and an n-type semiconductor layer, and further includes the other components if necessary.

The p-type semiconductor layer and the n-type semiconductor layer are in contact with each other.

—P-Type Semiconductor Layer—

A material of the p-type semiconductor layer is not particularly limited and may be appropriately selected depending on the intended purpose.

An average thickness of the p-type semiconductor layer is not particularly limited and may be appropriately selected depending on the intended purpose, but is preferably from 50 nm through 2,000 nm.

—N-Type Semiconductor Layer—

An average thickness of the n-type semiconductor layer is not particularly limited and may be appropriately selected depending on the intended purpose, but is preferably from 50 nm through 2,000 nm.

—Insulator Layer—

The insulator layer is the oxide or oxynitride insulator film of the present disclosure.

An average thickness of the oxide or oxynitride insulator film is not particularly limited and may be appropriately selected depending on the intended purpose. However, the average thickness is preferably from 50 nm through 2,000 nm.

—Anode (Positive Electrode)—

The anode is in contact with the p-type semiconductor layer.

A material of the anode is not particularly limited and may be appropriately selected depending on the intended purpose. Examples of the material include metals (e.g., Mo, Al, Au, Ag, and Cu) and alloys thereof, transparent electrically conductive oxides such as indium tin oxide (ITO) and antimony-doped tin oxide (ATO), and organic conductors such as polyethylenedioxythiophene (PEDOT) and polyaniline (PANI).

A shape, a size, and a structure of the anode are not particularly limited and may be appropriately selected depending on the intended purpose.

The anode is provided to be in contact with the p-type semiconductor layer. An ohmic contact is preferably formed between the anode and the p-type semiconductor layer.

A method for forming the anode is not particularly limited and may be appropriately selected depending on the intended purpose. Examples of the method include (i) a method for forming the anode by forming a film through, for example, the sputtering method or the dip coating method and then patterning the film through photolithography; and (ii) a method for forming the anode by directly forming a film having a desired shape through the printing process, such as inkjet printing, nanoimprinting, or gravure printing.

—Cathode (Negative Electrode)—

A material of the cathode is not particularly limited and may be appropriately selected depending on the intended purpose. Examples of the material include the same materials as the materials exemplified in the description of the anode.

A shape, a size, and a structure of the cathode are not particularly limited and may be appropriately selected depending on the intended purpose.

The cathode is provided to be in contact with the n-type semiconductor layer. An ohmic contact is preferably formed between the cathode and the n-type semiconductor layer.

A method for forming the cathode is not particularly limited and may be appropriately selected depending on the intended purpose. Examples of the method include the same methods as the formation methods exemplified in the description of the anode.

EXAMPLES

The present disclosure will next be described by way of Examples, but the present disclosure should not be construed as being limited to these Examples.

Example 1-1

<Preparation of Coating Liquid for Forming Oxide or Oxynitride Insulator Film>

Bismuth 2-ethylhexanoate 2-ethylhexanoic acid solution (Bi: 25% by mass) and hafnium 2-ethylhexanoate 2-ethylhexanoic acid solution (Hf: 24% by mass) were provided and weighed so that amounts of the respective metal elements were 60 mmol and 40 mmol. Then, they were mixed in a flask. Furthermore, 2-ethylhexanoic acid (octylic acid) was added thereto so that the total amount of the solvent was 1,000 mL in total, and was dissolved through mixing at room temperature to prepare a coating liquid for forming an oxide or oxynitride insulator film.

Examples 1-2 to 1-6

In the same manner as in Example 1-1, coating liquids of Examples 1-2 to 1-6 for forming an oxide or oxynitride insulator film were prepared. Table 1 presents material formulations of Example 1-1 to Example 1-6. All of the coating liquids were transparent in the visible region.

TABLE 1

| Example | Coating liquid No | Material A (including A elemen) | | Material B (including B element) | | Material C (including C element) | |
|---|---|---|---|---|---|---|---|
| | | Compound | mmol | Compound | mmol | Compound | mmol |
| 1-1 | 1-1 | $Bi(C_8H_{15}O_2)_3$ | 60 | $Hf(C_8H_{15}O_2)_4$ | 40 | | |
| 1-2 | 1-2 | $Y(NO_3)_3 \cdot 6H_2O$ | 70 | | | $Mg(NO_3)_2 \cdot 6H_2O$ | 10 |
| | | $Sc(NO_3)_3 \cdot 5H_2O$ | 20 | | | | |
| 1-3 | 1-3 | $Ce(C_6H_{15}O_2)_3$ | 70 | $Zr(acac)_4$ | 25 | $Ba(C_6H_{15}O_2)_2$ | 5 |
| 1-4 | 1-4 | $La(C_6H_{15}O_2)_3$ | 80 | $Ti(OC_4H_9)_4$ | 10 | $Sr(C_{10}H_{19}O_2)_2$ | 10 |
| 1-5 | 1-5 | $TeCl_4$ | 60 | $GaCl_3$ | 25 | $CaCl_2 \cdot 2H_2O$ | 15 |
| 1-6 | 1-6 | $Sb(C_6H_5)_3$ | 50 | $Zr(acac)_4$ | 45 | $Ba(C_{10}H_{19}O_2)_2$ | 5 |

TABLE 1-continued

| | | Solvent D (Class II petroleums) | | Solvent E (Class III petroleums) | | Solvent F | |
|---|---|---|---|---|---|---|---|
| Example | | Compound | mL | Compound | mL | Compound | mL |
| 1-1 | | | | Octylic acid | 1000 | | |
| 1-2 | | PGME | 500 | PG | 500 | H₂O | 90 |
| 1-3 | | Mesitylene | 300 | Octylic acid | 700 | | |
| 1-4 | | Xylene | 700 | CHB | 300 | | |
| 1-5 | | DMF | 420 | EG | 420 | 0.2M·HCl | 150 |
| 1-6 | | Mesitylene | 700 | CHB | 300 | | |

Examples 2-1 to 2-12

In the same manner as in Example 1-1, coating liquids of Examples 2-1 to 2-12 for forming an oxide or oxynitride insulator film were prepared. Table 2 presents material formulations of Examples 2-1 to 2-12. All of the coating liquids were transparent in the visible region.

TABLE 2

| Example | Coating liquid No | Material A (including A element) Compound | mmol | Material B (including B element) Compound | mmol | Material C (including C element) Compound | mmol |
|---|---|---|---|---|---|---|---|
| 2-1 | 2-1 | La(NO₃)₃·6H₂O | 84 | HfCl₂O·8H₂O | 8 | CaCl₂·2H₂O | 8 |
| 2-2 | 2-2 | Y(C₈H₁₅O₂)₃ | 84 | Zr(C₈H₁₅O₂)₄ | 8 | Ca(C₁₀H₁₉O₂)₂ | 8 |
| 2-3 | 2-3 | La(C₈H₁₅O₂)₃ | 50 | Hf(C₈H₁₅O₂)₄ | 25 | Sr(C₈H₁₅O₂)₂ | 25 |
| 2-4 | 2-4 | Y(C₈H₁₅O₂)₃ | 66 | Zr(C₈H₁₅O₂)₄ | 17 | Sr(C₁₀H₁₉O₂)₂ | 17 |
| 2-5 | 2-5 | La(C₈H₁₅O₂)₃ | 81 | Hf(acac)₄ | 8 | Sr(C₈H₁₅O₂)₂ | 8 |
| 2-6 | 2-6 | Bi(NO₃)₃·5H₂O | 65 | ZrO(NO₃)₂·2H₂O | 30 | Mg(NO₃)₂·6H₂O | 5 |
| 2-7 | 2-7 | La(NO₃)₃·6H₂O | 87 | ZrCl₂O·8H₂O | 9 | Ca(NO₃)₂·4H₂O | 4 |
| 2-8 | 2-8 | Y(C₈H₁₅O₂)₃ | 87 | Hf(C₈H₁₅O₂)₄ | 9 | Sr(C₁₀H₁₉O₂)₂ | 4 |
| 2-9 | 2-9 | La(C₈H₁₅O₂)₃ | 81 | Ti(OC₄H₉)₄ | 14 | Sr(C₈H₁₅O₂)₂ | 5 |
| 2-10 | 2-10 | Nd(C₁₀H₁₉O₂)₃ | 80 | Hf(OC₄H₉)₄ | 13 | Ba(C₁₀H₁₉O₂)₂ | 7 |
| 2-11 | 2-11 | La(CH₃COO)₃ | 78 | ZrO(CH₃COO)₂ | 11 | Ca(CH₃COO)₂·H₂O | 11 |
| 2-12 | 2-12 | Lu(NO₃)₃·H₂O | 80 | ZrO(NO₃)₂·2H₂O | 12 | Mg(NO₃)₂·6H₂O | 8 |

| | Solvent D (Class II petroleums) | | Solvent E (Class III petroleums) | | Solvent F | |
|---|---|---|---|---|---|---|
| Example | Compound | mL | Compound | mb | Compound | mL |
| 2-1 | EGME | 200 | EG | 200 | H₂O | 200 |
| 2-2 | Mesitylene | 400 | CHB | 400 | | |
| 2-3 | n-Decane | 200 | Octylic acid | 400 | | |
| 2-4 | 1-Hexanol | 200 | CHB | 800 | | |
| 2-5 | Mesitylene | 500 | Octylic acid | 500 | | |
| 2-6 | 1-Pentanol | 300 | PG | 500 | 0.1M·HNO₃ | 200 |
| 2-7 | 1-Butanol | 200 | GBL | 300 | H₂O | 300 |
| 2-8 | Decalin | 500 | CHB | 500 | | |
| 2-9 | Xylene | 200 | Octylic acid | 800 | | |
| 2-10 | Acetylacetone | 300 | CHB | 700 | | |
| 2-11 | | | | | H₂O | 1000 |
| 2-12 | DMF | 200 | DMI | 700 | 0.1M·HNO₃ | 100 |

Comparative Examples 1-1 to 1-3

In the same manner as in Example 1-1, coating liquids of Comparative Examples 1-1 to 1-3 for forming an oxide or oxynitride insulator film were prepared. Table 3 presents material formulations of Comparative Examples 1-1 to 1-3. In the visible region, the coating liquids (3-1 and 3-3) of Comparative Example 1-1 and Comparative Example 1-3 were transparent but the coating liquid (3-2) of Comparative Example 1-2 was blue.

TABLE 3

| Example | Coating liquid No | Material A (including A element) Compound | mmol | Material B (including B element) Compound | mmol | Material C (including C element) Compound | mmol |
|---|---|---|---|---|---|---|---|
| 1-1 | 3-1 | $La(NO_3)_3 \cdot 6H_2O$ | 70 | | | | |
| 1-2 | 3-2 | | | | | $Ba(C_8H_{15}O_2)_2$ | 60 |
| 1-3 | 3-3 | | | $ZrCl_2O \cdot 8H_2O$ | 30 | $SrCl_2 \cdot 6H_2O$ | 70 |

| Example | Material G Compound | mmol | Solvent H Compound | mL | Solvent J Compound | mL |
|---|---|---|---|---|---|---|
| 1-1 | $Al(NO_3)_3 \cdot 9H_2O$ | 30 | Methanol | 700 | BBP | 300 |
| 1-2 | $Cu(C_{10}H_{19}O_2)_2$ | 40 | Toluene | 800 | DOP | 200 |
| 1-3 | | | Ethanol | 700 | BBP | 300 |

Names of materials and solvents in Table 1, Table 2, and Table 3 are as follows. In addition, those capable of being used as a raw material are also described below.

<Material A>
 $Sc(NO_3)_3 \cdot 5H_2O$: Scandium nitrate pentahydrate
 $Ce(C_8H_{15}O_2)_3$: Cerium 2-ethylhexanoate
 $Ce(NO_3)_3 \cdot 6H_2O$: Cerium nitrate hexahydrate
 $Ce(CH_3COO)_3 \cdot H_2O$: Cerium acetate monohydrate
 $Y(C_8H_{15}O_2)_3$: Yttrium 2-ethylhexanoate
 $Y(C_{10}H_{19}O_2)_3$: Yttrium neodecanoate
 $YCl_3 \cdot 6H_2O$: Yttrium chloride hexahydrate
 $Y(NO_3)_3 \cdot 6H_2O$: Yttrium nitrate hexahydrate
 $Y(CH_3COO)_3 \cdot 4H_2O$: Yttrium acetate tetrahydrate
 $La(C_8H_{15}O_2)_3$: Lanthanum 2-ethylhexanoate
 $LaCl_3 \cdot 6H_2O$: Lanthanum chloride hexahydrate
 $La(NO_3)_3 \cdot 6H_2O$: Lanthanum nitrate hexahydrate
 $La(CH_3COO)_3$: Lanthanum acetate
 $Nd(C_8H_{15}O_2)_3$: Neodymium 2-ethylhexanoate
 $Nd(C_{10}H_{19}O_2)_3$: Neodymium neodecanoate
 $Lu(NO_3)_3 \cdot H_2O$: Lutetium nitrate monohydrate
 $Sb(C_6H_5)_3$: Triphenylantimony
 $Bi(C_8H_{15}O_2)_3$: Bismuth 2-ethylhexanoate
 $Bi(NO_3)_3 \cdot 5H_2O$: Bismuth nitrate pentahydrate
 $TeCl_4$: Tellurium chloride
 Here, $Bi(C_8H_{15}O_2)_3$, $Ce(C_8H_{15}O_2)_3$, and $Nd(C_8H_{15}O_2)_3$ were used as a 2-ethylhexanoic acid (octylic acid) solution thereof.
 $La(C_8H_{15}O_2)_3$ was used a xylene solution thereof or an octylic acid solution thereof.

<Material B>
 $Ti(OC_4H_9)_4$: Titanium butoxide
 $Zr(C_8H_{15}O_2)_4$: Zirconium 2-ethylhexanoate
 $Zr(acac)_4$: Zirconium acetylacetonate
 $ZrO(CH_3COO)_2$: Zirconium oxyacetate
 $ZrO(NO_3)_2 \cdot 2H_2O$: Zirconium oxynitrate dihydrate
 $ZrCl_2O \cdot 8H_2O$: Zirconium oxychloride octahydrate
 $Hf(C_8H_{15}O_2)_4$: Hafnium 2-ethylhexanoate
 $Hf(OC_4H_9)_4$: Hafnium butoxide
 $Hf(acac)_4$: Hafnium acetylacetonate
 $HfCl_2O \cdot 8H_2O$: Hafnium oxychloride octahydrate
 $GaCl_3$: Gallium chloride <Material C>
 $MgCl_2 \cdot 6H_2O$: Magnesium chloride hexahydrate
 $Mg(NO_3)_2 \cdot 6H_2O$: Magnesium nitrate hexahydrate
 $Ca(C_8H_{15}O_2)_2$: Calcium 2-ethylhexanoate
 $Ca(C_{10}H_{19}O_2)_2$: Calcium neodecanoate
 $Ca(CH_3COO)_2 \cdot H_2O$: Calcium acetate monohydrate
 $CaCl_2 \cdot 2H_2O$: Calcium chloride dihydrate
 $Ca(NO_3)_2 \cdot 4H_2O$: Calcium nitrate tetrahydrate
 $Sr(C_8H_{15}O_2)_2$: Strontium 2-ethylhexanoate
 $Sr(C_{10}H_{19}O_2)_2$: Strontium neodecanoate
 $SrCl_2 \cdot 6H_2O$: Strontium chloride hexahydrate
 $Ba(C_8H_{15}O_2)_2$: Barium 2-ethylhexanoate
 $Ba(C_{10}H_{19}O_2)_2$: Barium neodecanoate
 $Ba(C_8H_{15}O_2)_2$: Barium 2-ethylhexanoate
 $BaCl_2 \cdot 2H_2O$: Barium chloride dihydrate
 Here, $Ca(C_8H_{15}O_2)_2$, $Sr(C_8H_{15}O_2)_3$, and $Ba(C_8H_{15}O_2)_3$ were used as an octylic acid solution thereof.

<Material G>
 $Al(NO_3)_3 \cdot 9H_2O$: Aluminum nitrate nonahydrate
 $Cu(C_{10}H_{19}O_2)_2$: Copper neodecanoate
 Here, $Cu(C_{10}H_{19}O_2)_2$ was used as a toluene solution thereof.

<Solvent D>
 EGME: Ethylene glycol monomethyl ether
 PGME: Propylene glycolmonomethyl ether
 DMF: Dimethylformamide <Solvent E>
 PG: 1,2-Propylene glycol
 EG: Ethylene glycol
 CHB: Cyclohexylbenzene
 GBL: γ-Butyrolactone
 DMI: 1,3-Dimethyl-2-imidazolidinone
 DMPU: N,N'-Dimethylpropyleneurea <Solvent F>
 $H_2O$: Water
 0.2 M-HCl: 0.2 mol/L Hydrochloric acid
 0.1 M-$HNO_3$: 0.1 mol/L Nitric acid <Solvent J>
DOP: Dioctyl phthalate
BBP: Benzyl butyl phthalate Example 1-7

Using a spin-coating device, the coating liquid 1-1 in Table 1 was printed on an alkali-free glass substrate, which had been washed with UV-ozone. The printing was favorably performed. The substrate was dried for 10 minutes on a hot plate that had been heated to 120° C. and was baked for 1 hour at 400° C. in the atmosphere to obtain a transparent oxide film.

Examples 1-8 to 1-12

In the same manner as in Example 1-7, the coating liquid 1-2 (Example 1-8), the coating liquid 1-3 (Example 1-9), the coating liquid 1-4 (Example 1-10), the coating liquid 1-5 (Example 1-11), and the coating liquid 1-6 (Example 1-12) in Table 1 were each printed, dried, and baked to obtain oxide films similar to the above-described oxide film. All of the oxide films exhibited the same favorable printing property as that of Example 1-7.

Examples 2-13 to 2-23

In the same manner as in Example 1-7, the coating liquids 2-1 to 2-11 in Table 2 were each printed, dried, and baked to obtain oxide films similar to the above-described oxide film. All of the oxide films exhibited the same favorable printing property as that of Example 1-7.

Example 2-13: Coating liquid 2-1
Example 2-14: Coating liquid 2-2
Example 2-15: Coating liquid 2-3
Example 2-16: Coating liquid 2-4
Example 2-17: Coating liquid 2-5
Example 2-18: Coating liquid 2-6
Example 2-19: Coating liquid 2-7
Example 2-20: Coating liquid 2-8
Example 2-21: Coating liquid 2-9
Example 2-22: Coating liquid 2-10
Example 2-23: Coating liquid 2-11

Example 2-24

In the same manner as in Example 1-7, the coating liquid 2-12 in Table 2 was printed, dried, and baked except that the drying and the baking were performed in airstream of $O_2/N_2=2/98$ (sccm) as an atmosphere, to obtain a transparent oxynitride film. The oxynitride film exhibited the same favorable printing property as that of Example 1-7.

Example 3-1

The flash point of the coating liquid 2-7 presented in Table 2 was measured through the Seta closed cup method. It was confirmed that the flash point thereof was 49° C. and was sufficiently higher than room temperature.

The coating liquids 1-1 to 1-6, the coating liquids 2-1 to 2-6, and the coating liquids 2-8 to 2-12 had a flash point of 40° C. or more (note that, the flash point of the coating liquid 2-11 was not detected.)

Table 4 and Table 5 present flash points.

TABLE 4

| Example | Coating liquid No | Flash point ° C. |
|---|---|---|
| 3-1 | 1-1 | 117 |
| 3-2 | 1-2 | 48 |
| 3-3 | 1-3 | 77 |
| 3-4 | 1-4 | 41 |
| 3-5 | 1-5 | 73 |
| 3-6 | 1-6 | 65 |

TABLE 5

| Example | Coating liquid No | Flash point ° C. |
|---|---|---|
| 4-1 | 2-1 | 52 |
| 4-2 | 2-2 | 63 |
| 4-3 | 2-3 | 61 |
| 4-4 | 2-4 | 78 |
| 4-5 | 2-5 | 66 |
| 4-6 | 2-6 | 58 |
| 4-7 | 2-7 | 49 |
| 4-8 | 2-8 | 74 |
| 4-9 | 2-9 | 43 |
| 4-10 | 2-10 | 48 |
| 4-11 | 2-11 | ND |
| 4-12 | 2-12 | 76 |

Comparative Example 2-1

The flash point of the coating liquid 3-1 presented in Table 3 was measured through the Seta closed cup method. It was confirmed that the flash point thereof was 24° C. and was almost room temperature.

Example 1-13

On an alkali-free glass substrate that had been washed with UV-ozone, 100 nm of Al was deposited through a mask as a bottom electrode. The coating liquid 1-1 in Table 1 was printed on the alkali-free glass substrate through spin coating. A film-forming property was favorable. The substrate was dried at 120° C. for 1 hour in the atmosphere in an oven and was baked at 400° C. for 1 hour in the atmosphere to obtain an oxide film. Then, as an upper electrode, 100 nm of Al was deposited through a mask to form a capacitor structure.

Figure 7:
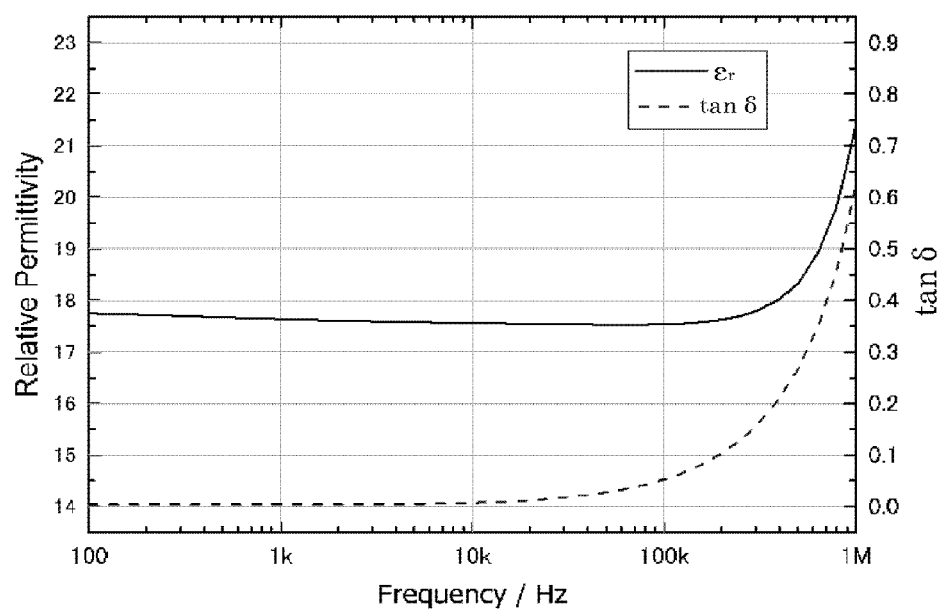
FIG. 7 is a graph presenting frequency dependences of relative permittivity and dielectric loss of the oxide insulator film or the oxynitride insulator film prepared in Example 1-13.

FIG. 7 is a graph presenting a relationship between the relative permittivity $\varepsilon_r$ and the frequency of the electric field applied and a relationship between the dielectric loss tan δ and the frequency of the electric field applied in the capacitor produced in the present Example. As presented in FIG. 7, it was confirmed that the capacitor produced in the present Example exhibited the relative permittivity s of 17.5 or more in a region of from 100 Hz through 1 MHz and had a high relative permittivity. Moreover, it was confirmed that the value of the dielectric loss tan δ was a low value of about 1% or less in a region of from 100 Hz through 100 kHz and the capacitor was found to have a favorable insulating film. Furthermore, it was confirmed that the film was transparent in the visible region and had a band gap energy of 3.5 eV or more.

Oxide insulator films, which were transparent and favorable similarly to the oxide insulator film of the coating liquid 1-1, were obtained from the coating liquids 1-2 to 1-6 and the coating liquids 2-1 to 2-12.

These capacitors obtained from the above oxide insulator films had a relative permittivity $\varepsilon_r$ of 8.5 or more and a dielectric loss tan δ of about 1% or less, and had the favorable insulating property.

Comparative Example 2-2

In the same manner as in Example 1-13, the coating liquid 3-2 in Table 3 was printed to form a capacitor structure.

The film was greyish brown and had a dielectric loss of 10% or more at 1 kHz, which did not function as the insulating film.

Comparative Example 2-3

In the same manner as in Example 1-13, the coating liquid 3-3 in Table 3 was printed to form a capacitor structure.

The film was slightly white and semitransparent and had a dielectric loss of 8% or more at 1 kHz, which did not function as the insulating film.

Examples 1-14 to 1-19 and Example 2-25 to 2-36

<Production of Field-Effect Transistor>
—Formation of Gate Electrode—
An alkali-free glass substrate was washed through ultrasonic wave using a neutral detergent, pure water, and isopropyl alcohol. The substrate was dried and was subjected to a UV-ozone treatment at 90° C. for 10 minutes. On the alkali-free glass substrate, a film of Mo (100 nm) was formed through the DC magnetron sputtering method and was patterned through the photolithography method to form a gate electrode.
—Formation of Gate Insulating Layer—
Then, each of the following coating liquids was coated on the gate electrode and the alkali-free glass substrate using a spin-coating device.
Example 1-14: Coating liquid 1-1
Example 1-15: Coating liquid 1-2
Example 1-16: Coating liquid 1-3
Example 1-17: Coating liquid 1-4
Example 1-18: Coating liquid 1-5
Example 1-19: Coating liquid 1-6
Example 2-25: Coating liquid 2-1
Example 2-26: Coating liquid 2-2
Example 2-27: Coating liquid 2-3
Example 2-28: Coating liquid 2-4
Example 2-29: Coating liquid 2-5
Example 2-30: Coating liquid 2-6
Example 2-31: Coating liquid 2-7
Example 2-32: Coating liquid 2-8
Example 2-33: Coating liquid 2-9
Example 2-34: Coating liquid 2-10
Example 2-35: Coating liquid 2-11
Example 2-36: Coating liquid 2-12

The substrate was dried for 10 minutes on a hot plate that had been heated to 120° C. and was baked at 400° C. for 1 hour in the atmosphere. Then, the substrate was annealed at 300° C. for 1 hour in the atmosphere to obtain a gate insulating layer. An average thickness of the gate insulating layer obtained was about 150 nm.
—Formation of Source Electrode and Drain Electrode—
Next, on the gate insulating layer, a film of ITO (100 nm) was formed through the DC magnetron sputtering method and was patterned through the photolithography method to form a source electrode and a drain electrode. Here, a channel width determined by length of the source electrode and length of the drain electrode was 30 μm and a channel length determined by an interval between the source electrode and the drain electrode was 10 μm.
—Formation of Active Layer—
Next, on the gate insulating layer, a film of IGZO (20 nm) was formed through the DC magnetron sputtering method and was patterned through the photolithography method. Then, the substrate was annealed at 300° C. for 1 hour in the atmosphere to obtain an active layer.

As described above, a field-effect transistor was produced.

Comparative Example 3-1

Figure 8:
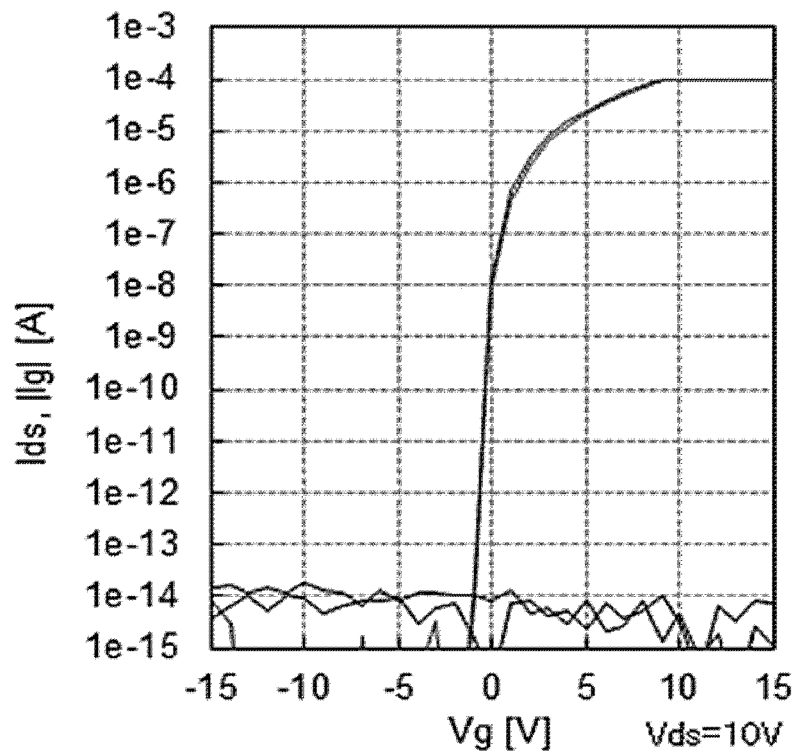
FIG. 8 is a graph presenting a relationship between electric current Ids between the source electrode and the drain electrode and an absolute value of the gate electric current |Igs| with respect to the gate voltage Vgs of the field-effect transistor produced in Example 2-29.

A field-effect transistor was produced in the same manner as in Example 1-14. Here, the gate insulating layer was formed by forming a film of $SiO_2$ (200 nm) through the RF magnetron sputtering method.
<Evaluation>
—Carrier Mobility and ON/OFF Ratio—
A semiconductor parameter-analyzer device (semiconductor parameter analyzer B 1500A, available from Agilent Technologies, Inc.) was used to measure the field-effect transistor obtained for a relationship between a gate voltage (Vgs) and a source-drain current (Ids) when a source-drain voltage (Vds) was 10 V. Results of Example 2-29 are presented in the graph of FIG. 8. From FIG. 8, it can be confirmed that favorable transistor properties without exhibiting hysteresis were obtained. Here, in FIG. 8, "e" denotes the exponent of 10. For example, "1e·04" is "0.0001". The same is also applicable to the "E" in Table 6 etc.

The carrier mobility was calculated in the saturation region. In addition, the ON/OFF ratio was determined. Regarding the Ids, compliance is applied at 1E-04 A and an electric current value of 1E-04 A or more is not measured. The OFF current value is similar to or lower than the measurement limit (about 1 fA), which is considerably favorable. The gate current |Igs| is about 10 fA. Therefore, it is found that the insulating property of the gate insulating film of the present disclosure is considerably high. Results are presented in Table 6.

TABLE 6

| μ [cm²/Vs] | ON/OFF | Vth [V] | S [V/dec] |
|---|---|---|---|
| 11.26 | 1.0E+09 | 0.99 | 0.16 |

The field-effect transistor where the oxide or oxynitride insulator was used for the gate insulating layer, which was obtained by coating the coating liquid of the present disclosure for forming an oxide or oxynitride insulator film as presented in Examples 1-14 to 1-19 and Examples 2-25 to 2-36 exhibited favorable transistor properties such as a high carrier mobility and a high ON/OFF ratio even at the process temperature of about 400° C.

When the [NA+NB]/[NA+NB+NC] satisfies the Formula (1), the relative permittivity and the dielectric loss of the gate insulating layer are considerably suitable for those required in the gate insulating layer of the field-effect transistor. Therefore, the field-effect transistor exhibited considerably favorable transistor properties such as a considerably high carrier mobility and a considerably high ON/OFF ratio.

Figure 9:
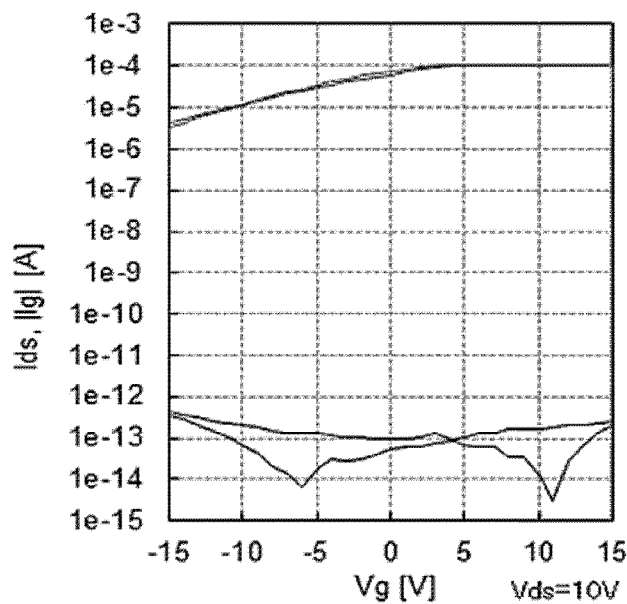
FIG. 9 is a graph presenting a relationship between electric current Ids between the source electrode and the drain electrode and an absolute value of the gate electric current |Igs| with respect to the gate voltage Vgs of the field-effect transistor produced in Comparative Example 3-1.

Properties of the field-effect transistor of Comparative Example 3-1 are presented in FIG. 9. In Comparative Example 3-1, the TFT characteristics were a strong depletion state and thus the Von was not clearly observed. Moreover, the |Igs| was 10⁻¹³ A order, which was comparatively higher than those of Examples.

As described above, the field-effect transistor produced in the present disclosure is suitable for widening process margin and stabilizing the TFT characteristics at a high level. Moreover, the display element of the present disclosure is suitable for enabling a drive at a high speed, lowering unevenness between the elements, and improving reliability. Moreover, the image display device of the present disclosure is suitable for displaying an image having high quality even if being a large size. The system of the present disclosure can display image information with high precision, and can be suitably used for, for example, television devices and computer systems.

Aspects of the present disclosure are as follows, for example.

<1> A coating liquid for forming an oxide or oxynitride insulator film, the coating liquid including:
A element;
at least one selected from the group consisting of B element and C element; and
a solvent,
wherein the A element is at least one selected from the group consisting of Sc, Y, Ln (lanthanoid), Sb, Bi, and Te,
the B element is at least one selected from the group consisting of Ga, Ti, Zr, and Hf,
the C element is at least one selected from the group consisting of Group 2 elements in a periodic table, and
the solvent includes at least one selected from the group consisting of an organic solvent having a flash point of 21° C. or more but less than 200° C. and water.
<2> The coating liquid for forming an oxide or oxynitride insulator film according to <1>,
wherein the at least one selected from the group consisting of B element and C element includes at least the B element.
<3> The coating liquid for forming an oxide or oxynitride insulator film according to <1>,
wherein the at least one selected from the group consisting of B element and C element includes at least the C element.
<4> The coating liquid for forming an oxide or oxynitride insulator film according to any one of <1> to <3>,
wherein the A element is at least one selected from the group consisting of Sc, Y, and Ln (lanthanoid).
<5> The coating liquid for forming an oxide or oxynitride insulator film according to any one of <1> to <4>,
wherein the A element is at least one selected from the group consisting of Sb, Bi, and Te.
<6> The coating liquid for forming an oxide or oxynitride insulator film according to any one of <1> to <5>,
wherein the B element is at least one selected from the group consisting of Ti, Zr, and Hf.
<7> The coating liquid for forming an oxide or oxynitride insulator film according to any one of <1> to <6>,
wherein the C element is at least one selected from the group consisting of Mg, Ca, Sr, and Ba.
<8> The coating liquid for forming an oxide or oxynitride insulator film according to any one of <1> to <7>,
wherein the coating liquid has a flash point of 37.8° C. (100° F.) or more.
<9> The coating liquid for forming an oxide or oxynitride insulator film according to any one of <1> to <8>,
wherein the coating liquid has a flash point of 40° C. or more.
<10> The coating liquid for forming an oxide or oxynitride insulator film according to any one of <1> to <9>,
wherein the coating liquid has a flash point of 50° C. or more.
<11> The coating liquid for forming an oxide or oxynitride insulator film according to any one of <1> to <10>,
wherein the coating liquid for forming an oxide or oxynitride insulator film is free of a solvent having a flash point of less than 21° C.
<12> The coating liquid for forming an oxide or oxynitride insulator film according to any one of <1> to <11>,
wherein the coating liquid for forming an oxide or oxynitride insulator film is transparent or light yellow in a visible light region.
<13> The coating liquid for forming an oxide or oxynitride insulator film according to any one of <1> to <12>,
wherein a total number of atoms of the A element (NA), a total number of atoms of the B element (NB), and a total number of atoms of the C element (NC) satisfy Formula (1) below:

$$(NA+NB)/(NA+NB+NC) \geq 0.5 \quad \text{Formula (1)}.$$

<14> The coating liquid for forming an oxide or oxynitride insulator film according to any one of <1> to <13>,
wherein a total number of atoms of the A element (NA), a total number of atoms of the B element (NB), and a total number of atoms of the C element (NC) satisfy Formula (2) below:

$$NA/(NA+NB+NC) \geq 0.5 \quad \text{Formula (2)}.$$

<15> The coating liquid for forming an oxide or oxynitride insulator film according to any one of <1> to <14>,
wherein an A element-including compound including the A element is dissolved in the solvent, and
the A element-including compound is at least one selected from the group consisting of inorganic salts, oxides, hydroxides, organic acid salts, metal alkoxides, organometallics, and metal complexes.
<16> The coating liquid for forming an oxide or oxynitride insulator film according to any one of <1> to <15>,
wherein an A element-including compound including the A element and a B element-including compound including the B element are dissolved in the solvent,
the A element-including compound is at least one selected from the group consisting of inorganic salts, oxides, hydroxides, organic acid salts, metal alkoxides, organometallics, and metal complexes, and
the B element-including compound is at least one selected from the group consisting of inorganic salts, oxides, hydroxides, organic acid salts, metal alkoxides, organometallics, and metal complexes.
<17> The coating liquid for forming an oxide or oxynitride insulator film according to any one of <1> to <15>,
wherein an A element-including compound including the A element, a B element-including compound including the B element, and a C element-including compound including the C element are dissolved in the solvent,
the A element-including compound is at least one selected from the group consisting of inorganic salts, oxides, hydroxides, organic acid salts, metal alkoxides, organometallics, and metal complexes,
the B element-including compound is at least one selected from the group consisting of inorganic salts, oxides, hydroxides, organic acid salts, metal alkoxides, organometallics, and metal complexes, and
the C element-including compound is at least one selected from the group consisting of inorganic salts, oxides, hydroxides, organic acid salts, metal alkoxides, organometallics, and metal complexes.

<18> The coating liquid for forming an oxide or oxynitride insulator film according to any one of <1> to <17>, wherein the solvent is at least one selected from the group consisting of organic acids, organic acid esters, aromatic compounds, diols, glycol ethers, polar aprotic solvents, alkane compounds, alkene compounds, ether compounds, and alcohols.

<19> A method for producing an oxide or oxynitride insulator film, the method including
coating the coating liquid for forming an oxide or oxynitride insulator film according to any one of <1> to <18> on an object to be coated and drying, followed by baking.

<20> A method for producing a field-effect transistor, the method including:
forming a gate electrode;
forming a gate insulating layer on the gate electrode;
forming a source electrode and a drain electrode on the gate insulating layer to be spaced from each other; and
forming an active layer on the gate insulating layer and in a channel region between the source electrode and the drain electrode, the active layer being formed of a semiconductor,
wherein the forming a gate insulating layer is coating, on a layer of the gate electrode, the coating liquid for forming an oxide or oxynitride insulator film according to any one of <1> to <18> to form the gate insulating layer formed of an oxide insulator or an oxynitride insulator.

<21> A method for producing a field-effect transistor, the method including:
forming a source electrode and a drain electrode to be spaced from each other;
forming an active layer in a channel region between the source electrode and the drain electrode, the active layer being formed of a semiconductor; forming a gate insulating layer on the active layer; and
forming a gate electrode on the gate insulating layer,
wherein the forming a gate insulating layer is coating the coating liquid for forming an oxide or oxynitride insulator film according to any one of <1> to <18> to form the gate insulating layer formed of an oxide insulator or an oxynitride insulator.

<22> A method for producing a field-effect transistor, the method including:
forming an active layer formed of a semiconductor;
forming a gate insulating layer on the active layer;
forming a gate electrode on the gate insulating layer;
forming an interlayer dielectric on the gate electrode;
forming through holes in the gate insulating layer or the interlayer dielectric; and
forming a source electrode and a drain electrode on the interlayer dielectric,
wherein the forming a gate insulating layer is coating the coating liquid for forming an oxide or oxynitride insulator film according to any one of <1> to <18> to form the gate insulating layer formed of an oxide insulator or an oxynitride insulator.

<23> The method for producing a field-effect transistor according to any one of <20> to <22>,
wherein, in the forming a gate insulating layer, a total number of atoms of the A element (NA), a total number of atoms of the B element (NB), and a total number of atoms of the C element (NC) in the coating liquid for forming an oxide or oxynitride insulator film are adjusted to control relative permittivity and dielectric loss of the oxide insulator or the oxynitride insulator.

<24> An oxide or oxynitride insulator film, which is a baked product of the coating liquid for forming an oxide or oxynitride insulator film according to any one of <1> to <18>.

<25> The oxide or oxynitride insulator film according to <24>, wherein the oxide or oxynitride insulator film has no optical absorption band resulting from electron transition in a visible light region or a near-infrared region.

<26> A semiconductor element including
the oxide or oxynitride insulator film according to <24> or <25>.

<27> A field-effect transistor including:
a gate electrode to which gate voltage is to be applied;
a source electrode and a drain electrode;
an active layer formed of a semiconductor film, which is formed between the source electrode and the drain electrode; and
a gate insulating layer formed between the gate electrode and the active layer,
wherein the gate insulating layer is the oxide or oxynitride insulator film according to <24> or <25>.

<28> The field-effect transistor according to <27>, wherein the active layer is an oxide semiconductor.

<29> The field-effect transistor according to <27>, wherein the active layer is amorphous silicon.

<30> The field-effect transistor according to <27>, wherein the active layer is a low-temperature poly-silicon.

What is claimed is:

1. A coating liquid suitable for forming an oxide or oxynitride insulator film, the coating liquid comprising:
A element:
at least one selected from the group consisting of B element and C element; and
a solvent,
wherein the A element is at least one selected from the group consisting of Sc, Y, a lanthanide, Sb, Bi, and Te,
wherein the B element is at least one selected from the group consisting of Ga, Ti, Zr, and Hf,
wherein the C element is at least one selected from the group consisting of Group 2 elements in a periodic table,
wherein the solvent includes at least one selected from the group consisting of an organic solvent having a flash point in a range of from 37.8 to 200° C. and water, and
wherein a total number of atoms of the A element (NA), a total number of atoms of the B element (NB), and a total number of atoms of the C element (NC) satisfy formulas (1), (2), and (3):

$$(NA+NB)/(NA+NB+NC) \geq 0.5 \quad (1)$$

$$NA/(NA+NB+NC) \geq 0.5 \quad (2)$$

$$NB > NC \quad (3)$$

2. The coating liquid of claim 1, comprising the B element.

3. The coating liquid of claim 1, comprising the C element.

4. The coating liquid of claim 1, wherein the A element is at least one selected from the group consisting of Sc, Y, and a lanthanide.

5. The coating liquid of claim 1, wherein the A element is at least one selected from the group consisting of Sb, Bi, and Te.

6. The coating liquid of claim 2, wherein the B element is at least one selected from the group consisting of Ti, Zr, and Hf.

7. The coating liquid of claim 3, wherein the C element is at least one selected from the group consisting of Mg, Ca, Sr, and Ba.

8. The coating liquid of claim 1, wherein a first compound including the A element is dissolved in the solvent, and
wherein the first compound is at least one selected from the group consisting of an inorganic salt, oxide, hydroxide, organic acid salt, metal alkoxide, organometallic, and metal complex.

9. The coating liquid of claim 1, wherein a first compound including the A element and a second compound including the B element are dissolved in the solvent,
wherein the first compound is at least one selected from the group consisting of an inorganic salt, oxide, hydroxide, organic acid salt, metal alkoxide, organometallic, and metal complex, and
wherein the second compound is at least one selected from the group consisting of an inorganic salt, oxide, hydroxide, organic acid salt, metal alkoxide, organometallic, and metal complex.

10. The coating liquid of claim 1, wherein a first compound including the A element, a second compound including the B element, and a third compound including the C element are dissolved in the solvent,
wherein the first compound is at least one selected from the group consisting of an inorganic salt, oxide, hydroxide, organic acid salt, metal alkoxide, organometallic, and metal complex,
wherein the second compound is at least one selected from the group consisting of an inorganic salt, oxide, hydroxide, organic acid salt, metal alkoxide, organometallic, and metal complex, and
wherein the third compound is at least one selected from the group consisting of an inorganic salt, oxide, hydroxide, organic acid salt, metal alkoxide, organometallic, and metal complex.

11. A method for producing an oxide or oxynitride insulator film, the method comprising coating the coating liquid of claim 1 on an object to be coated and drying, followed by baking.

12. A method for producing a field-effect transistor, the method comprising:
forming a gate electrode;
forming a gate insulating layer on the gate electrode;
forming a source electrode and a drain electrode on the gate insulating layer configured to be spaced from each other; and
forming an active layer on the gate insulating layer and in a channel region between the source electrode and the drain electrode, the active layer being formed of a semiconductor,
wherein the forming a gate insulating layer comprises coating, on a layer of the gate electrode, the coating liquid of claim 1 to form the gate insulating layer formed of an oxide insulator or an oxynitride insulator.

13. A method for producing a field-effect transistor, the method comprising:
forming a source electrode and a drain electrode configured to be spaced from each other;
forming an active layer in a channel region between the source electrode and the drain electrode, the active layer being formed of a semiconductor;
forming a gate insulating layer on the active layer; and
forming a gate electrode on the gate insulating layer,
wherein the forming a gate insulating layer comprises coating the coating liquid of claim 1 to form the gate insulating layer formed of an oxide insulator or an oxynitride insulator.

14. A method for producing a field-effect transistor, the method comprising:
forming an active layer formed of a semiconductor;
forming a gate insulating layer on the active layer;
forming a gate electrode on the gate insulating layer;
forming an interlayer dielectric on the gate electrode;
forming through holes in the gate insulating layer or the interlayer dielectric; and
forming a source electrode and a drain electrode on the interlayer dielectric,
wherein the forming a gate insulating layer comprises coating the coating liquid of claim 1 to form the gate insulating layer formed of an oxide insulator or an oxynitride insulator.

15. An oxide or oxynitride insulator film, which is a baked product of the coating liquid of claim 1.

16. The film of claim 15, wherein the oxide or oxynitride insulator film has no optical absorption band resulting from electron transition in a visible light region or a near-infrared region.

17. A field-effect transistor comprising:
a gate electrode to which gate voltage is to be applied;
a source electrode and a drain electrode;
an active layer formed of a semiconductor film; and
a gate insulating layer formed between the gate electrode and the active layer,
wherein the gate insulating layer is the film of claim 15.

18. The coating liquid of claim 1, wherein the A element comprises Sb, Te, and/or Ce, and
wherein the solvent comprises mesitylene, n-decane, octylic acid, 1-hexanol, 1-pentanol, 1-butanol, decalin, 1,2-xylene, 1,3-xylene, 1,4-xylene, acetyl acetone, propylene glycol monomethyl ether, 1,2-propylene glycol, cyclohexylbenzene, γ-butyrolactone, 1,3-dimethyl-2-imidazolidinone, N,N'-dimethylpropyleneurea, water, 0.2 mol/L hydrochloric acid, 0.1 mol/L nitric acid, dioctyl phthalate, and/or benzyl butyl phthalate.

19. The coating liquid of claim 18, comprising
Ce, Zr, and Ba,
La, Ti, and Sr,
Te, Ga, and Ca,
Sb, Zr, and Ba,
La, Hf, and Ca,
Y, Zr, and Ca,
La, Hf, and Sr,
Y, Zr, and Sr,
Bi, Zr, and Mg,
La, Zr, and Ca,
Y, Hf, and Sr,
La, Ti, and Sr,
Nd, Hf, and Ba, or
Lu, Zr, and Mg.

20. The coating liquid of claim 18, wherein the A element comprises Ce and the B element comprises Ba.

* * * * *